United States Patent
Shankar et al.

(10) Patent No.: US 10,063,237 B2
(45) Date of Patent: Aug. 28, 2018

(54) SCALABLE INTEGRATED MOSFET (SIM)

(71) Applicant: AnDAPT, Inc., San Jose, CA (US)

(72) Inventors: Kapil Shankar, Saratoga, CA (US);
Minjong Kim, San Jose, CA (US);
John Birkner, Woodside, CA (US);
Patrick J. Crotty, San Jose, CA (US);
Thomas Chan, Saratoga, CA (US)

(73) Assignee: AnDAPT, INC., San Jose, CA (US)

( * ) Notice: Subject to any disclaimer, the term of this patent is extended or adjusted under 35 U.S.C. 154(b) by 0 days.

(21) Appl. No.: 15/656,954

(22) Filed: Jul. 21, 2017

(65) Prior Publication Data
US 2018/0026640 A1 Jan. 25, 2018

Related U.S. Application Data

(60) Provisional application No. 62/365,333, filed on Jul. 21, 2016.

(51) Int. Cl.
*H03K 19/177* (2006.01)

(52) U.S. Cl.
CPC ..... *H03K 19/177* (2013.01); *H03K 19/17784* (2013.01); *H03K 19/17792* (2013.01)

(58) Field of Classification Search
CPC ........... H03K 19/177; H03K 19/17784; H03K 19/17792
USPC ....................................................... 326/38, 44
See application file for complete search history.

(56) References Cited

U.S. PATENT DOCUMENTS

| | | | | |
|---|---|---|---|---|
| 4,850,232 A | * | 7/1989 | Markis | G01B 17/00 73/1.81 |
| 7,498,835 B1 | * | 3/2009 | Rahman | G06F 1/3203 326/38 |
| 7,809,864 B1 | * | 10/2010 | Young | G06F 1/266 326/83 |
| 2005/0091629 A1 | * | 4/2005 | Eisenstadt | G06F 17/505 326/81 |
| 2005/0237083 A1 | * | 10/2005 | Bakker | G01K 7/015 326/47 |

* cited by examiner

*Primary Examiner* — Don Le
(74) *Attorney, Agent, or Firm* — Innovation Counsel, LLP

(57) ABSTRACT

A high voltage power block includes a high voltage power transistor; and a switch driver configured to drive a gate of the high voltage power transistor. The high voltage power block is integrated in a programmable logic device (PLD) including a programmable fabric, a signal wrapper configured to provide signals between the high voltage power transistor and the programmable fabric, and a plurality of internal components. The plurality of internal components integrated in the PLD are programmably connected and characteristics of the high voltage power transistor are programmably adjusted using the programmable fabric and the signal wrapper.

20 Claims, 22 Drawing Sheets

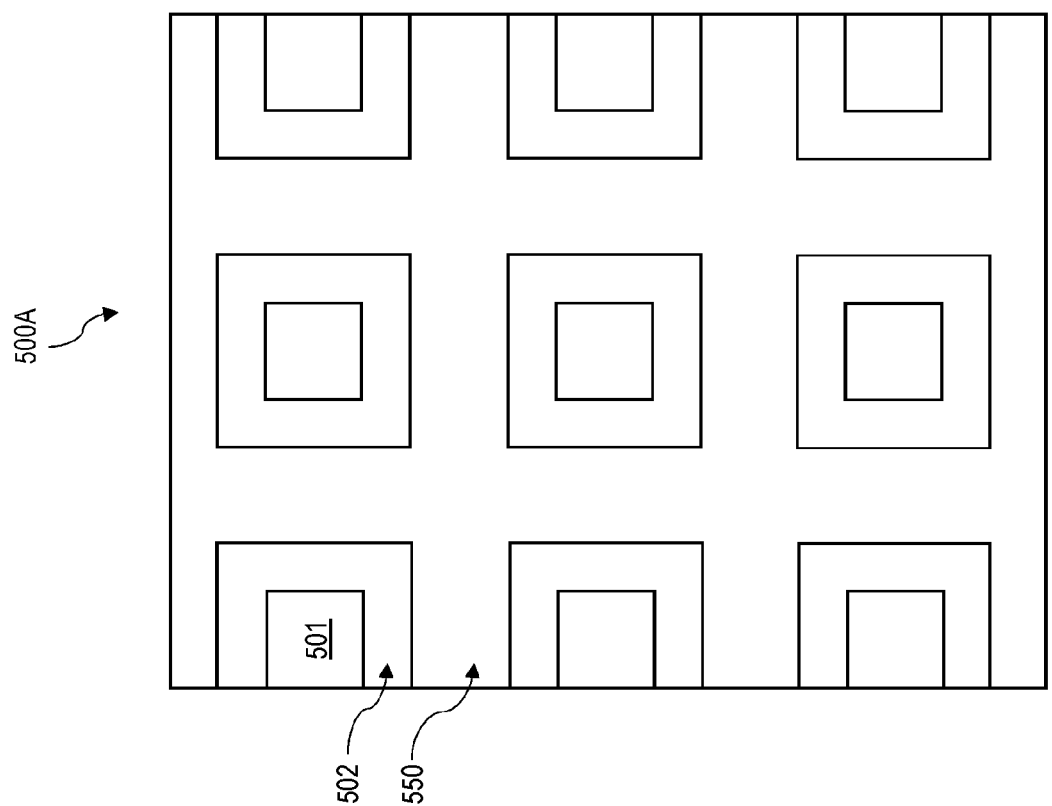

SCALABLE INTEGRATED MOSFET (SIM)

CROSS-REFERENCE TO RELATED APPLICATION(S)

This application claims the benefits of and priority to U.S. Provisional Patent Application Ser. No. 62/365,333 filed Jul. 21, 2016, the disclosure of which is incorporated herein by reference in their entirety.

TECHNICAL FIELD

The present disclosure relates generally to programmable logic devices (PLDs), more particularly, to a scalable metal-oxide-semiconductor field-effect transistor (MOSFET) block integrated in a PLD.

BACKGROUND

Programmable logic devices (PLDs) such as programmable logic array (PLA) devices, programmable array logic (PAL) devices, and field-programmable gate arrays (FPGAs) have been in the market place for a long time. These PLDs can be programmed by users for a wide variety of applications and industries. Functional blocks have been integrated to expand the capabilities of the PLDs. These functional blocks can be digital and/or analog that are designed to perform specific functions to complement or supplement the programmable components of the PLDs.

PLDs can have internal elements or fabrics that are programmable and connected together to perform a specific function. More complex devices can add functional blocks to the programming fabrics. These functional blocks can be a combination of digital and analog circuitry, such as a serial interface, a voltage reference, a comparator, an analog-to-digital (A/D) converter, etc. Some devices can be optimized for speed, power, flexibility, complexity, and/or cost. These devices can interface with the external world via input/output (I/O) pins. These I/O pins can typically function up to 5V and sourcing/sinking current up to 50 mA.

Some power applications such as a power regulator and a power converter may require a higher voltage and/or a higher current that the devices and their I/O pins can handle. Users can add an external discrete high-voltage power MOSFET to an existing PLD to expand its application to high-voltage/current power applications. The discrete high-voltage power MOSFET requires another package, adding more cost and requiring more board space.

SUMMARY

According to one embodiment, a high voltage power block includes: a high voltage power transistor; and a switch driver configured to drive a gate of the high voltage power transistor. The high voltage power block is integrated in a programmable logic device (PLD) including a programmable fabric, a signal wrapper configured to provide signals between the high voltage power block and the programmable fabric, and a plurality of internal components. The plurality of internal components integrated in the PLD are programmably connected and characteristics of the high voltage power transistor are programmably adjusted using the programmable fabric and the signal wrapper.

According to another embodiment, a programmable logic device (PLD) includes: a plurality of high voltage power blocks; a programmable fabric; a plurality of signal wrappers, each of the plurality of signal wrappers being configured to provide signals between the corresponding high voltage power block and the programmable fabric; and a plurality of internal components. Each of the plurality of high voltage power blocks includes: a high voltage power transistor; and a switch driver configured to drive a gate of the high voltage power transistor. The plurality of internal components integrated in the PLD are programmably connected and characteristics of the high voltage power transistor are programmably adjusted using the programmable fabric and the signal wrapper.

The above and other preferred features, including various novel details of implementation and combination of events, will now be more particularly described with reference to the accompanying figures and pointed out in the claims. It will be understood that the particular systems and methods described herein are shown by way of illustration only and not as limitations. As will be understood by those skilled in the art, the principles and features described herein may be employed in various and numerous embodiments without departing from the scope of the present disclosure.

BRIEF DESCRIPTION OF THE DRAWINGS

The accompanying drawings, which are included as part of the present specification, illustrate the presently preferred embodiment and together with the general description given above and the detailed description of the various embodiments given below serve to explain and teach the principles described herein.

FIG. 5A illustrates a schematic block diagram of an analog and digital adaptive platform, according to one embodiment;

Figure 1:
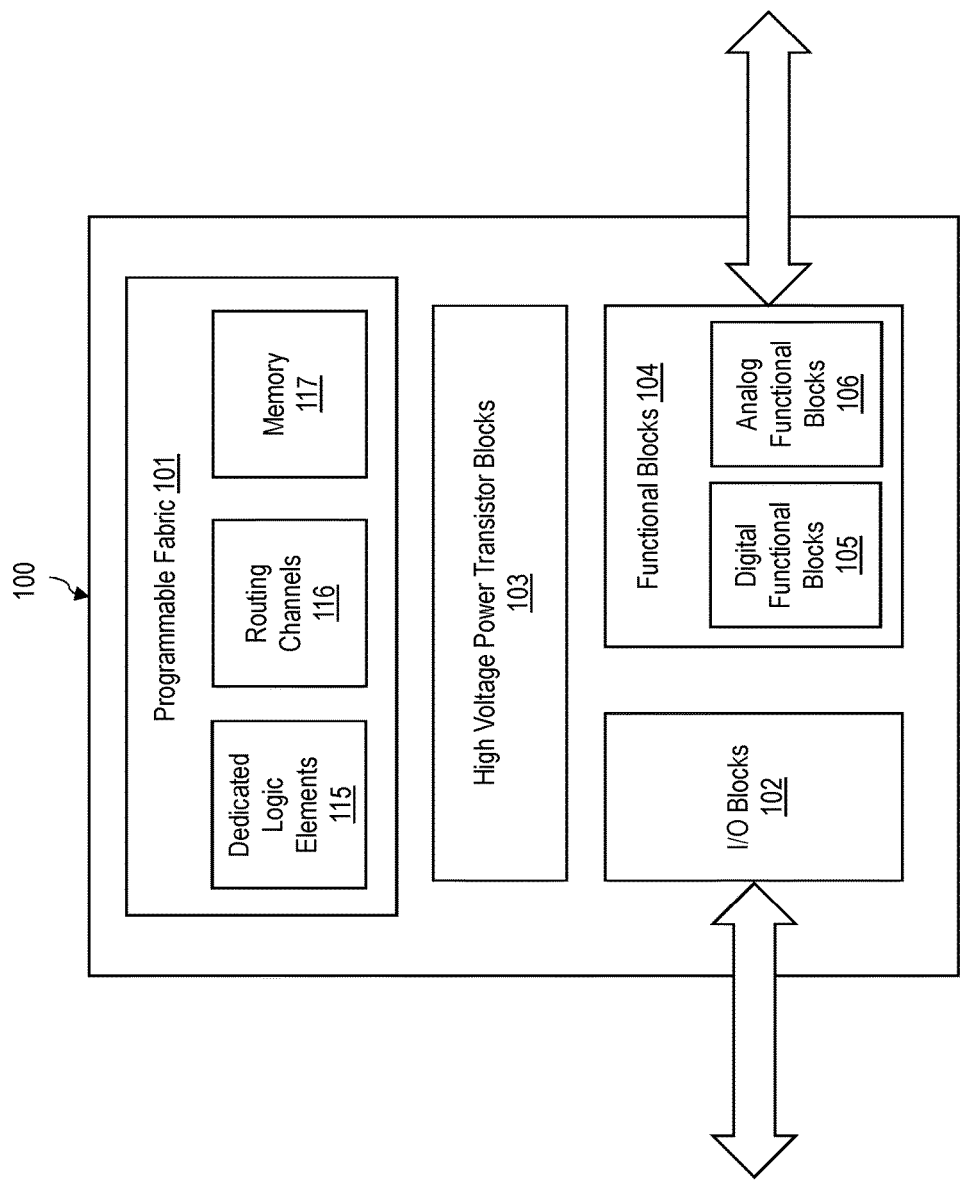
FIG. 1 shows a block diagram of an example programmable logic device, according to one embodiment.

The figures are not necessarily drawn to scale and elements of similar structures or functions are generally represented by like reference numerals for illustrative purposes throughout the figures. The figures are only intended to facilitate the description of the various embodiments described herein. The figures do not describe every aspect of the teachings disclosed herein and do not limit the scope of the claims.

DETAILED DESCRIPTION

Each of the features and teachings disclosed herein can be utilized separately or in conjunction with other features and teachings to provide a scalable metal-oxide-semiconductor field-effect transistor (MOSFET) block integrated in a PLD. Representative examples utilizing many of these additional features and teachings, both separately and in combination, are described in further detail with reference to the attached figures. This detailed description is merely intended to teach a person of skill in the art further details for practicing aspects of the present teachings and is not intended to limit the scope of the claims. Therefore, combinations of features disclosed in the detailed description may not be necessary to practice the teachings in the broadest sense, and are instead taught merely to describe particularly representative examples of the present teachings.

In the description below, for purposes of explanation only, specific nomenclature is set forth to provide a thorough understanding of the present disclosure. However, it will be apparent to one skilled in the art that these specific details are not required to practice the teachings of the present disclosure.

Some portions of the detailed descriptions herein are presented in terms of algorithms and symbolic representations of operations on data bits within a computer memory. These algorithmic descriptions and representations are used by those skilled in the data processing arts to effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the below discussion, it is appreciated that throughout the description, discussions utilizing terms such as "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The algorithms presented herein are not inherently related to any particular computer or other apparatus. Various general-purpose systems, computer servers, or personal computers may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the disclosure as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of an original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

The present disclosure generally describes a programmable logic device (PLD) integrated with various building blocks for providing a power solution and minimizing cost to market and a board space. In particular, the present disclosure relates to a user-programmable and configurable power block integrated in a PLD, herein referred to as a scalable integrated MOSFET (SIM) block. SIM may denote a segmented integrated MOSFET in some embodiments.

The present PLD can provide a power management platform for high-voltage and high-power applications such as power management, power convertors, industrial control, automobile, etc. using one or more integrated power blocks. The present PLD can be used to integrate dissimilar rails on a single chip.

The PLD can be configured as various types of regulators, switches, muxes, battery chargers, switching controllers, gate drivers, etc. Example configurations of the PLD include, but are not limited to, a buck regulator (current or voltage mode), a boost regulator, a multiphase buck regulator (current or voltage mode), a buck-boost regulator (voltage mode), a source side regulator, a drain-side regulator, a push-pull DDR regulator, a load switch, a battery charger (trickle constant current or constant voltage, power path).

Each of the power blocks integrated in the present PLD has an on-demand topology for use in various applications. The present PLD can lower the power consumption by on-demand power on/off and sequencing rails, and on-demand monitoring to handle throttle conditions and marginal loads. In one embodiment, the present PLD can be configured as an on-demand multiple point-of-load (POL) integrator in various forms of power converters such as a point-of-load (POL) converter, a POL regulator, a POL module, and a POL system. Depending on a target device/application, the PLD can be programmed to function as an integrator combining one or more of a buck regulator (either current or voltage mode), a boost regulator, a buck-boost regulator, a low drop-out (LDO) regulator, a load switch, a mux, a battery charger, an external switching controller, and a gate driver. The PLD can also be programmed to function as a pulse width modulator (PWM) for providing constant current (CC) in a current mode or a constant voltage (CV) in a voltage mode, a pulse frequency modulator (PFM), or a pulse skipping modulator (PSM).

The present PLD can integrate one or more applications targeted for dissimilar rails to reduce a board size and lower a package cost. The present PLD enables a telemetry across different rails using one or more generic interfaces such as general-purpose input/output (GPIO), I2C interface, and serial peripheral interface (SPI) over the digital and analog I/O pins that can include physical pads. Using one or more of these interfaces or over a power management bus (e.g., PMBus™), the present PLD can communicate with an external device for a telemetry and a remote control. The present PLD can use the telemetry and the remote control for creating and integrating multiple dissimilar POLs. The present PLD can provide digital multiphase operation, for example, auto align/spread phases.

FIG. 1 shows a block diagram of an example programmable logic device (PLD), according to one embodiment. The PLD 100 includes a programmable fabric 101, one or more I/O blocks 102, one or more high voltage power transistor blocks 103, and one or more functional blocks 104. In some embodiments, the PLD 100 is referred to as a power management integrated circuit (PMIC). The PMIC can convert one or more low power voltage inputs to one or more high power voltage outputs or convert one or more high voltage inputs to one or more low power voltage outputs. For example, a range of high voltages that the one or more high voltage power transistor blocks 103 can handle can encompass from 12V to 700V. The range of the high voltages can vary depending on the manufacturing process and/or the configuration of the one or more high voltage power transistor blocks 103 included in the PLD 100.

The programmable fabric 101 includes a number of uncommitted programmable logic elements including one or more dedicated logic elements 115 and routing channels 116. The dedicated logic elements 115 can include a plurality of flip flops and logic gates. The dedicated logic elements 115 and the routing channels 116 of the programmable fabric 101 can be programmed to selectively and programmably connect the I/O blocks 102, the high voltage power transistor blocks 103, and the dedicated logic elements 115 via the routing channels 116 to form one or more dedicated functions.

The programmable fabric 101 can include a memory 117 including a volatile memory (e.g., a static random-access memory (SRAM)), a non-volatile memory (e.g., a flash memory), or both. The memory 117 may include one or more look-up tables for digital compensation.

The I/O blocks 102 can include one or more digital and/or analog inputs and output buffers. Each of the I/O blocks 102 can receive signals from and transmit signals to an external device in a configurable voltage and current. In one embodiment, the I/O blocks 102 can handle signals of a low voltage (up to 5V) and low current (up to 50 mA).

The PLD 100 can include any number of high voltage power transistor blocks, for example, four, eight, and twelve depending on a size of the chip and requirement for an intended application. The high voltage power transistor blocks 103, herein also referred to as scalable integrated MOSFET (SIM) blocks, can be configured and programmed to be a constituent block or element of a more complex circuit or device. In one embodiment, the high voltage power transistor blocks 103 can support voltages ranging from 12V to 80V (or up to 700V if serially connected by programming the programmable fabric) and current up to 12A. The voltage and current limits that the high voltage power transistor blocks 103 can support may vary depending on an intended power application and the process technology used for manufacturing the PLD 100. According to one embodiment, the high voltage power transistor blocks 103 can integrate both n-channel and p-channel FETs.

According to one embodiment, the source and the drain of each the high voltage power transistors in the high voltage power transistor blocks 103 can be connected to external circuits and/or devices. The I/O pins of the I/O blocks 102 are primarily used for interfacing digital and analog sensory signals to and from an external device or component, and may not include the source and drain (or boost pin) of the high voltage power transistors. The presence of one or more high voltage power transistors on the same chip can provide flexible configurations of the PLD 100 by programming the programmable fabric 101. For example, different high voltage power transistors on the same chip can connect to different external power rails or sensor hubs. In another example, the high voltage power transistors can be externally connected in series via the source and the drain of the high voltage power transistors. The programmable fabric 101 can be programmed to connect the I/O blocks 102, the high voltage power transistor blocks 103, and the integrated logic elements 115 using the programmable routing channels 116 in various configurations to accommodate a wide range of power applications.

The functional blocks 104 can include one or more of digital functional blocks 105, analog functional blocks 106, or a combination of both. A digital functional block 105 can provide dedicated functions such as a serial interface, a communication protocol, and an application-specific control function. An analog functional block 106 can be an analog-to-digital converter (ADC), a comparator, a sensor, an amplifier, a voltage reference, a digital-to-analog converter (DAC), etc. The parameters of each of these functional blocks 104 such as a gain, a reference voltage, a frequency, a resolution can be configured by the programmable fabric 101. In addition, the programmable fabric 101 can programmably connect different functional elements within the functional blocks 104. Some of the functional blocks 104 such as a reference voltage can be available via external pins of the I/O blocks 102.

According to one embodiment, the programmable fabric 101 can take a form of a field programmable gate array (FPGA). The FPGA contains an array of programmable logic blocks (e.g., the dedicated logic elements 115) and reconfigurable interconnects (e.g., the routing channels 116) to programmably wire the logical blocks together using the reconfigurable interconnects. The logic blocks may include simple logic gates like AND gates and XOR gates and flip-flops or more complex blocks such as memory elements. The logic blocks and the reconfigurable interconnects can be configured to perform complex combinational functions in conjunction with the functional blocks 104.

According to one embodiment, the programmable fabric 101 may include a digital fabric and an analog fabric. The digital fabric corresponds to a portion of the programmable fabric 101 that provides digital interfaces among the constituent blocks including the I/O blocks 102, the high voltage power transistor blocks 103, and the digital functional blocks 105. For example, the digital fabric can provide the connectivity among the integrated analog blocks, digital logic elements, timers, digital I/O s, etc. The analog fabric corresponds to a portion of the programmable fabric 101 to provide analog interfaces with one or more external telemetry and sensor blocks, an I2C interface, an SPI interface, etc.

According to one embodiment, a high voltage power transistor implemented in the high voltage power transistor blocks 103 is a software-defined and programmable, configurable, optimizable, and scalable power MOSFET. The PLD 100 including such power MOSFETs can accelerate time to market for new products and standards and achieve a competitive response while lowering the capital and operational expenditure, and inventory. The programmability of the present PLD can provide flexibility in design and facilitate the implementation of user-configurable and field-programmable solutions and topologies in a developmental stage of a new product as well as in a commercialization stage for providing optimizable solutions to customers by offering flexible solutions depending on the needs and requirements of a target device/application.

Figure 2:
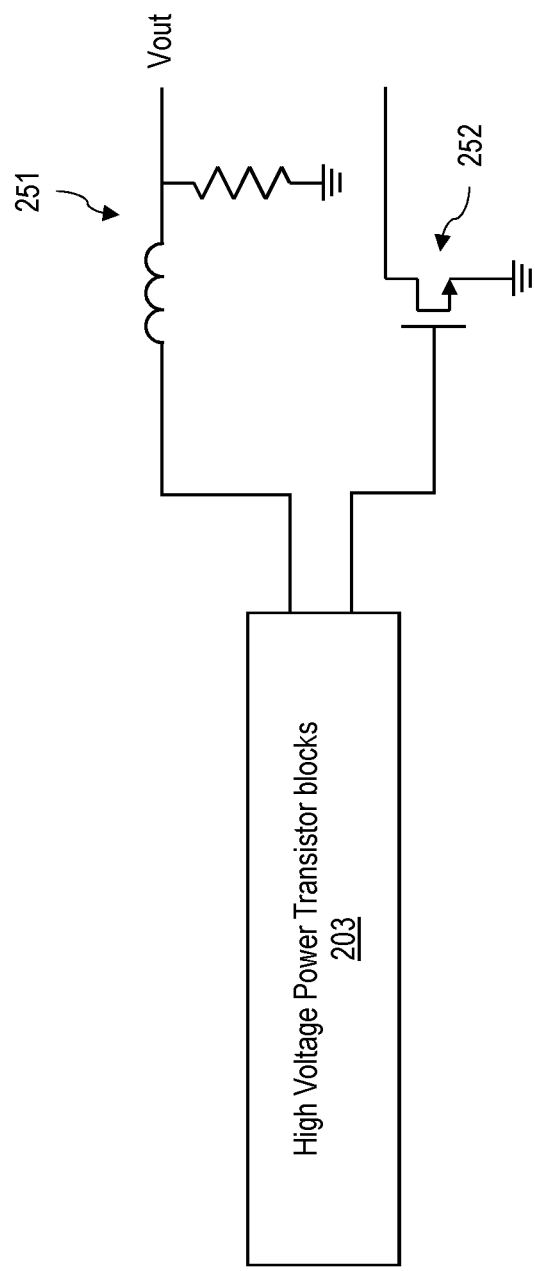
FIG. 2 shows an example use of a high voltage power transistor, according to one embodiment.

FIG. 2 shows an example use of a high voltage power transistor, according to one embodiment. The high voltage power transistor blocks 203 may include one or more high voltage power transistors and integrated in a PLD. Each of the high voltage power transistor in the block 203 may also be referred to as a SIM block. The high voltage power transistor blocks 203 can provide a power supply 251 generating an output voltage signal Vout and drive an external high voltage power transistor 252. The voltage limit that the external high voltage power transistor 252 can handle may be higher or lower than the voltage limit of the high voltage power transistors included in the high voltage power transistor blocks 203. In some embodiments, one or more power supplies 251 and/or one or more external high voltage power transistors 252 can be connected to the one or more high voltage power transistors if needed. The operating characteristics of the power supply 251 such as voltage levels of the output voltage Vout, turn-on and turn-off sequences, a switching frequency, a voltage ramp rate, tracking between outputs, protection and monitoring can be programmed by programming the integrated blocks and the programmable fabric of the PLD (e.g., the programmable fabric 101 of the PLD 100 in FIG. 1). Each of the power supplies 251, if more than one is needed, can be programmed to have different operating characteristics.

The maximum voltage of the high voltage power transistor may be limited by the process technology for manufacturing the PLD. In one embodiment, the voltage limit of the high voltage power transistor is about 80V. The external discrete power transistor 252 can be used if a higher voltage limit than the voltage limit of the high voltage power transistor (e.g., 80V) is needed. The operating parameters for the external power transistor 252, such as turn-on and turn-off ramp rates, a switching frequency, etc., can also be programmed by programming the integrated blocks and the programmable fabric as well.

Figure 3:
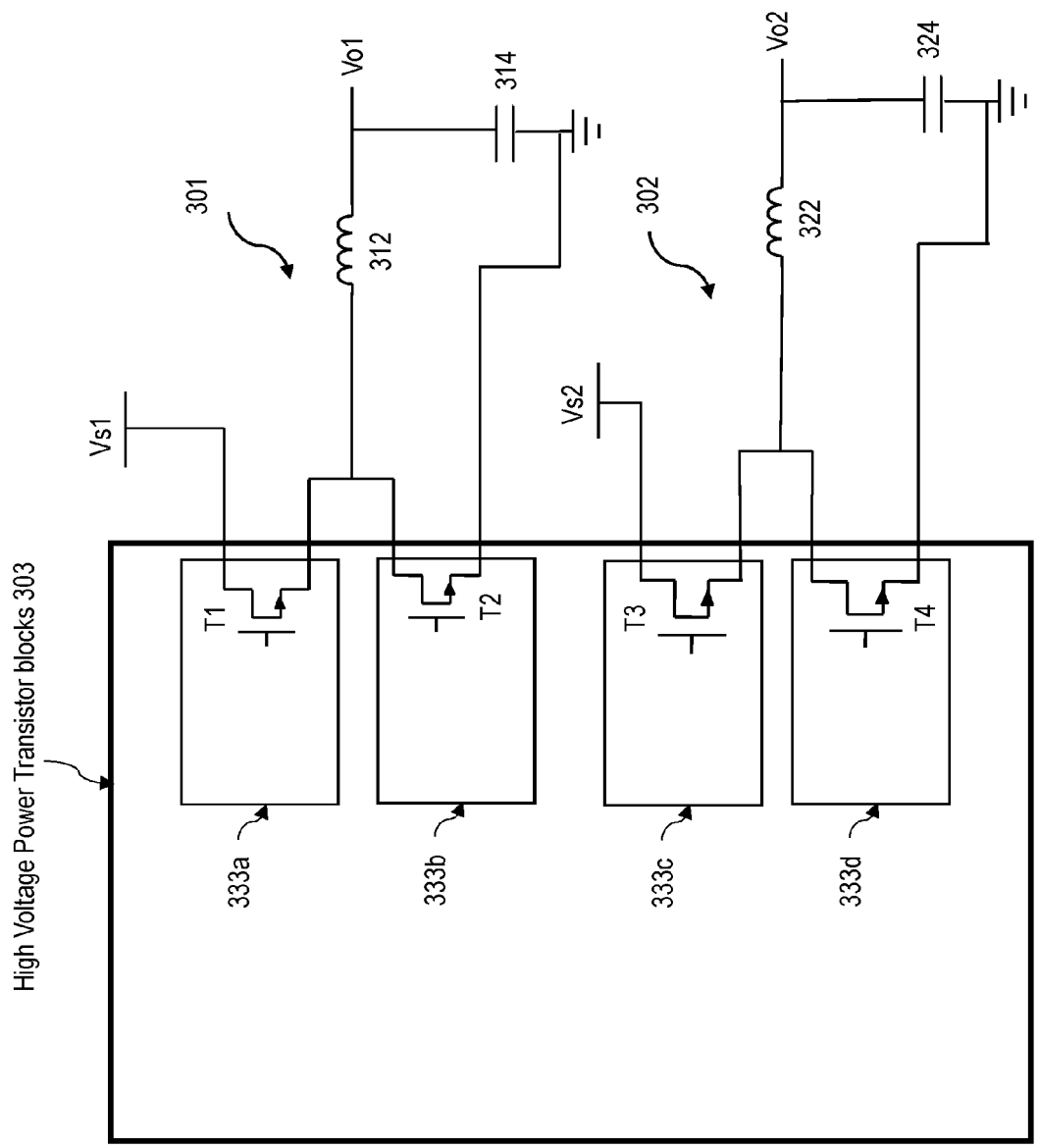
FIG. 3 shows an example dual buck converter, according to one embodiment.

FIG. 3 shows an example dual buck converter, according to one embodiment. The high voltage power transistor blocks 303 includes four high voltage power transistor blocks 333*a*, 333*b*, 333*c*, and 333*d*. For example, the high voltage power transistor blocks 303 correspond to the high voltage power transistor blocks 103 shown in FIG. 1. The high voltage power transistor blocks 303 can be configured to implement the dual buck converter including two buck converters 301 and 302. A buck converter is a DC-to-DC power converter that steps down voltage from an input (supply) to an output (load) while stepping up the current.

The buck converter 301 includes two high voltage power transistor blocks 333*a* and 333*b*. The two high voltage power transistors, T1 and T2 that are included in the high voltage power transistor blocks 333*a* and 333*b*, a filter inductor 312, and an output capacitor 314 are connected to form the buck converter 301. In one embodiment, the filter inductor 312 and the output capacitor 314 are externally provided and connected to the drain and source pads of the two high voltage power transistors T1 and T2. The high voltage power transistor T1 is a high side switching transistor, and the high voltage power transistor T2 is a low side switching transistor. The buck converter 301 can convert the system voltage Vs1 to a lower voltage Vo1. For example, the system voltage Vs1 can be 12V, 20V, 48V, or higher. The programmable fabric of the PLD can be programmed to control the operating parameters of the high voltage power transistors T1 and T2 such as a turn-on and turn-off sequence, a switching frequency, etc.

In addition, the buck converter 302 includes another two high voltage power transistors, T3 and T4 included in the high voltage power transistor blocks 333*c* and 333*d*, a filter inductor 322 and an output capacitor 324. In one embodiment, the filter inductor 322 and the output capacitor 324 are externally provided and connected to the drain and source pads of the two high voltage power transistors T3 and T4. The buck converter 302 can convert the system voltage Vs2 to a lower voltage Vo2. The system voltages Vs1 and Vs2 can be different or the same, can be from the same power rail, or can be from different power rails, from the same phase or from different phases. The operating parameters of each of the buck converters 301 and 302 can be controlled by programming the programmable fabric of the PLD. The operating parameters of the buck converters 301 and 301 can be programmed to be identical or different.

According to one embodiment, the high voltage power transistor blocks 333*a*, 333*b*, 333*c*, and 333*d* can be integrated into a PLD by different structures and different process technologies. In one embodiment, the high voltage power transistors are N-channel FETs. In another embodiment, the high voltage power transistors are P-channel FETs. It is noted that any type of FETs may be used or dissimilar types of FETs may be integrated in the same PLD without deviating from the scope of the present disclosure.

Examples of the process technology for fabricating discrete high voltage power transistors include, but are not limited to, junction field effect transistor (JFET), metal oxide field effect transistor (MOSFET) and insulated gate bipolar transistor (IGBT). The complementary metal oxide semiconductor (CMOS) process technology is one of the prevailing process technologies for fabricating various integrated circuits such as the PLD 100 of FIG. 1. The MOSFET technology is more compatible to integrate with the CMOS technology. According to one embodiment, there are different MOSFET structures for the present high voltage power transistors, such as double diffused MOS (DMOS), V-Groove MOS (VMOS), etc. Among these FET structures, DMOS may be suitable to integrate with the CMOS technology.

Figure 4:
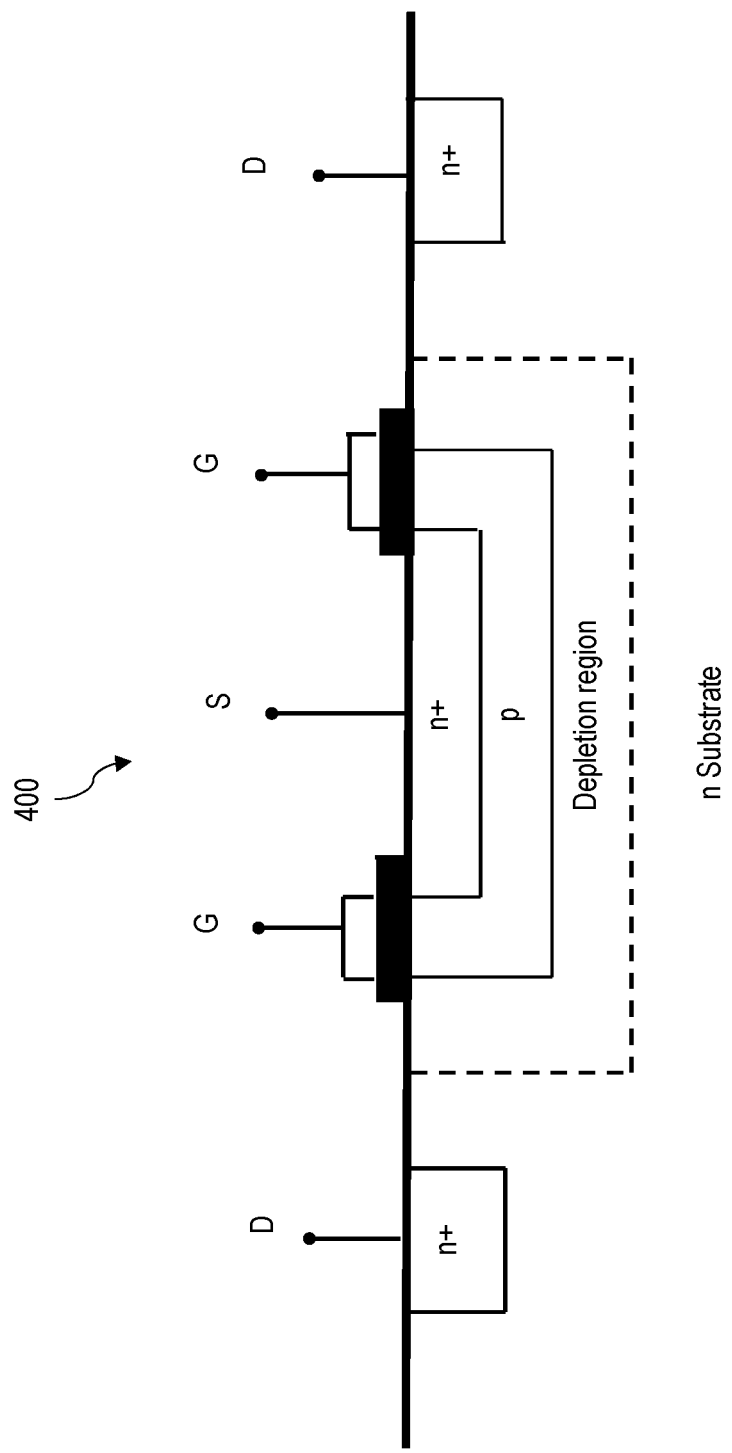
FIG. 4 shows an example of a DMOS high voltage power transistor integrated to a CMOS circuit, according to one embodiment.

FIG. 4 shows an example of a DMOS high voltage power transistor circuit, according to one embodiment. The DMOS power transistor circuit shown in FIG. 4 can be integrated with CMOS logic circuits on the same chip 400 to enable features that are otherwise not easily available with discrete implementations of DMOS and CMOS circuits on separate chips and connecting them together. Examples of such features include, but are not limited to, a programmable digital control of a low drop out (LDO) linear regulator and various digital protection features including, but not limited to, current measurement for over-current protection (OCP), current limit and short-circuit protection, over-voltage protection (OVP), under-voltage lock out (UVLO), current direction crossover for forced continuous conduction mode (FCCM), digital soft start and soft stop, and digital compensation in switching applications using a proportional-integral-derivative (PID) scheme.

The present PLD includes one or more analog functional blocks that are adaptive for providing various user-configurable analog functions. The adaptive analog blocks are wrapped with respective digital wrappers on the programmable fabric. The programmable fabric provides a programmable environment to build user-configurable custom analog functions by digitally combining one or more adaptive analog blocks by selectively and programmably interconnecting and combining the digital wrappers that provide interface to the adaptive analog blocks. The digital wrappers of the adaptive analog blocks eliminate the need to directly interconnect and/or interface analog blocks in an analog fashion with a variety of voltages, currents, common mode, isolation, noise isolation issues, or the like. Using the present adaptive analog blocks, analog functions can be readily built, on demand, targeting specific applications while meeting the requirements for the target device/applications.

According to one embodiment, the present disclosure provides an analog and digital adaptive platform for implementing various analog functions using adaptive analog blocks that are configurable and programmable in a digital domain. The adaptive analog blocks that are wrapped with digital wrappers can provide ease of fabrication and packaging various custom analog functions in a small chip size with a low cost compared to conventional analog ICs. The present adaptive platform can provide flexibility and adaptability for various circuit designs and for implementing on-demand analog functions adaptable to various applications on a single chip.

Examples of analog functions that the present adaptive platform can provide include, but are not limited to, switching converters, linear regulators, load switches, battery chargers, and external switching controllers. Beyond power applications, a broad spectrum of applications that the present adaptive platform is applicable to includes Internet of Things (IoT) devices, drones, electric vehicles (EVs), robotics, and various industrial applications utilizing external sensors for proximity, motion, position, tachometer, pitch, axis, yaw, light, pressure, temperature, humidity. The digital wrapper of the present adaptive platform can provide a digital PID control to various analog actuators including, but not limited to, DC motors, servo motors, stepper motors, motion control, breakers, fan controllers.

FIG. 5A illustrates a schematic block diagram of an analog and digital adaptive platform, according to one embodiment. The analog and digital adaptive platform 500A includes a plurality of analog and digital adaptive blocks 501 interconnected with signal wrappers 502 on a programmable fabric 550. Referring to FIG. 1, the adaptive blocks 501 correspond to any of the high voltage power transistor blocks 103, the digital functional blocks 105, and the analog functional blocks 106. Each of the adaptive blocks 501 arranged on the programmable fabric 550 is user-configurable and programmable by the coupled signal wrapper 502 to provide a user-configurable function for a target device/application or one or more circuit components of a target device/application.

A signal wrapper 502 provides an interface circuitry required for the coupled adaptive block 501 to interconnect with another adaptive block 501 and/or an I/O block (e.g., UO block 102 of FIG. 1) via the programmable fabric 550. According to one embodiment, the analog and digital adaptive platform 500A includes a predetermined number of adaptive blocks 501. Examples of the adaptive blocks 501 include, but are not limited to, an analog-to-digital converter (ADC) block, a comparator block, a memory block, a pulse-width modulation (PWM) block, a voltage reference block, and a timer block. In conjunction with one or more programmable analog and digital input/output (I/O) blocks (e.g., the I/O blocks 102 of FIG. 1), these adaptive blocks 501 can be programmably configured to build a variety of analog circuitry for various applications via the programmable fabric 550.

According to one embodiment, a signal wrapper 502 can include both a digital wrapper for providing interfaces for digital signals and an analog wrapper for providing interfaces for analog signals to the corresponding adaptive blocks 501. Similarly, the programmable fabric 550 can include a digital fabric and an analog fabric. In this case, the digital wrapper of the signal wrapper 502 can interface with the digital fabric of the programmable fabric 550, and the analog wrapper of the signal wrapper 502 can interface with the analog fabric of the programmable fabric 550.

According to one embodiment, each of the adaptive blocks 501 or a combination of multiple adaptive blocks 501 is programmed over the programmable fabric 550 to build a variety of analog circuitry for various power applications. Examples of such power applications include, but are not limited to a switching converter, a linear regulator, a load switch, a sensor, a battery charger, and an external switching controller. According to other embodiments, each of the adaptive blocks 501 or a combination of multiple adaptive blocks 501 is programmably configured to build a variety of analog circuitry for various non-power applications. Examples of non-power applications include, but are not limited to, an Internet of Things (IoT) device, a drone, an electric vehicle (EV), a robot, and various industrial applications utilizing one or more external sensors for sensing proximity, motion, position, tachometer, pitch, axis, yaw, light, pressure, temperature, humidity, etc. In conjunction with the adaptive blocks 501 and one or more of functional blocks (e.g., the functional blocks 104 of FIG. 1) and I/O blocks (e.g., the I/O blocks 102 of FIG. 1), the signal wrappers 502 of the analog and digital adaptive platform 500A can provide a digital proportional-integral-derivative (PID) control to various analog actuators including, but not limited to, a DC motor, a servo motor, a stepper motor, a motion control, breakers, and a fan controller.

Figure 5B:
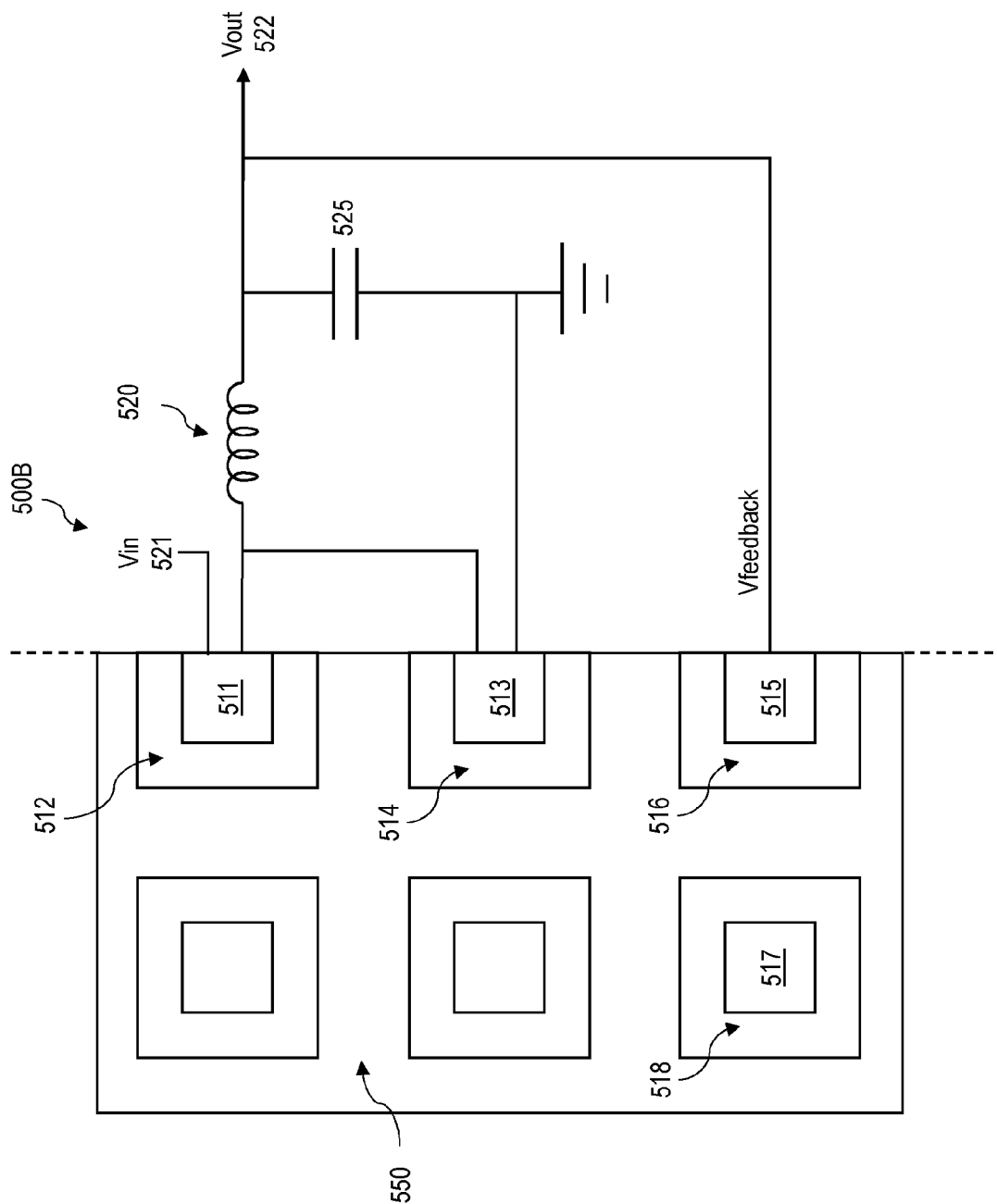
FIG. 5B illustrates an example of the analog and digital adaptive platform of FIG. 5A configured as a hysteretic mode buck switching converter, according to one embodiment.

FIG. 5B illustrates an example of the analog and digital adaptive platform of FIG. 5A configured as a hysteretic mode buck switching converter, according to one embodiment. The hysteretic mode buck switching converter 500B may also be referred to as a bang-bang buck switching converter. The hysteretic mode buck switching converter 500B is a DC-to-DC step-down power converter that converts an input voltage Vin 521 to an output voltage Vout 522 that is lower than the input voltage. The output current may be stepped up while the input voltage is stepped down. The hysteretic mode buck switching converter 500B can provide an efficient power conversion compared to a linear regulator that lowers the input voltage by dissipating power as heat without stepping up the output current.

The analog and digital adaptive platform 500B can be an example of the analog and digital adaptive platform 500A shown in FIG. 5A. For example, the adaptive blocks 511, 513, 515 and 517 are instances of the adaptive blocks 501 of FIG. 5A, the digital wrappers 512, 514, 516, and 518 are instances of the signal wrapper 502 of FIG. 5A. Each of the adaptive blocks 511, 513, 515 and 517 can be one of a comparator block, a memory block, a PWM block, a voltage reference block, and a timer block.

In the present example, the adaptive block 515 is a comparator block. According to one embodiment, the comparator block is included in the analog functional blocks 106 of FIG. 1. The adaptive blocks 511 and 513 drive a filter including an inductor 520 and a capacitor 525 in a synchronous mode. The feedback voltage, $V_{feedback}$, of the filter output 522 (e.g., 1.0V, 4 A) is connected to the comparator block 515. Various internal connections and routing channels are configured to interconnect the adaptive blocks 511, 513, 515 and 517. For example, the adaptive block 517 and the adaptive block 515 are interconnected using the digital wrapper 518 that provides a digital interface to the adaptive block 517, and the digital wrapper 516 that provides a digital interface to the adaptive block 515 via the programmable fabric 550. In a similar fashion, the adaptive block 517 and the adaptive block 513 can be interconnected with the digital wrapper 518 and digital wrapper 514, and the adaptive block 517 and the adaptive block 511 can be interconnected with the digital wrapper 518 and the digital wrapper 512 via the programmable fabric 550. In this example, the adaptive blocks 511, 513, 515 and 517 are configured as a hysteretic mode buck switching converter to provide a stepped-down voltage output.

Figure 6A:
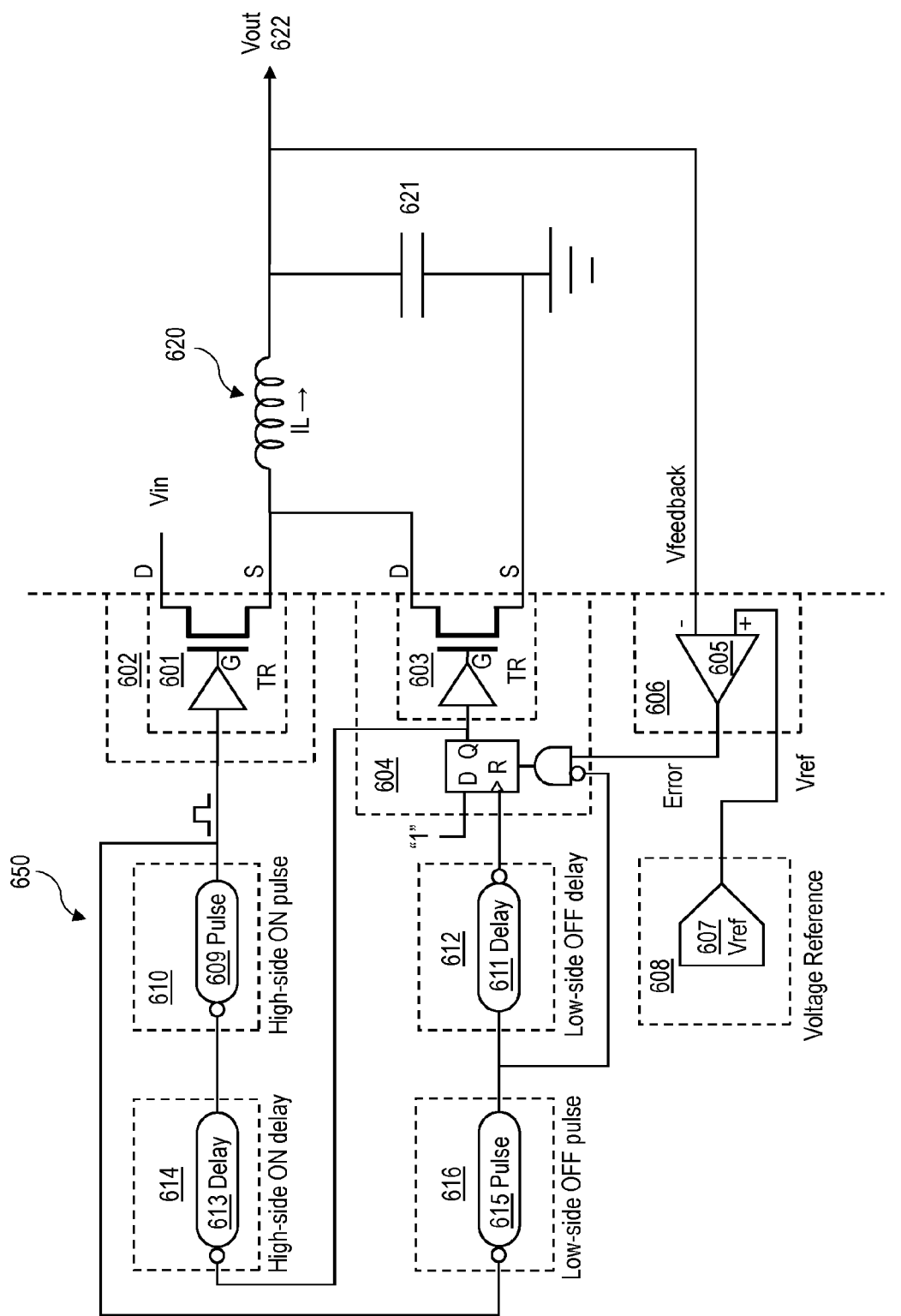
FIG. 6A illustrates a schematic diagram of an example hysteretic mode buck switching converter, according to one embodiment.
Figure 6B:
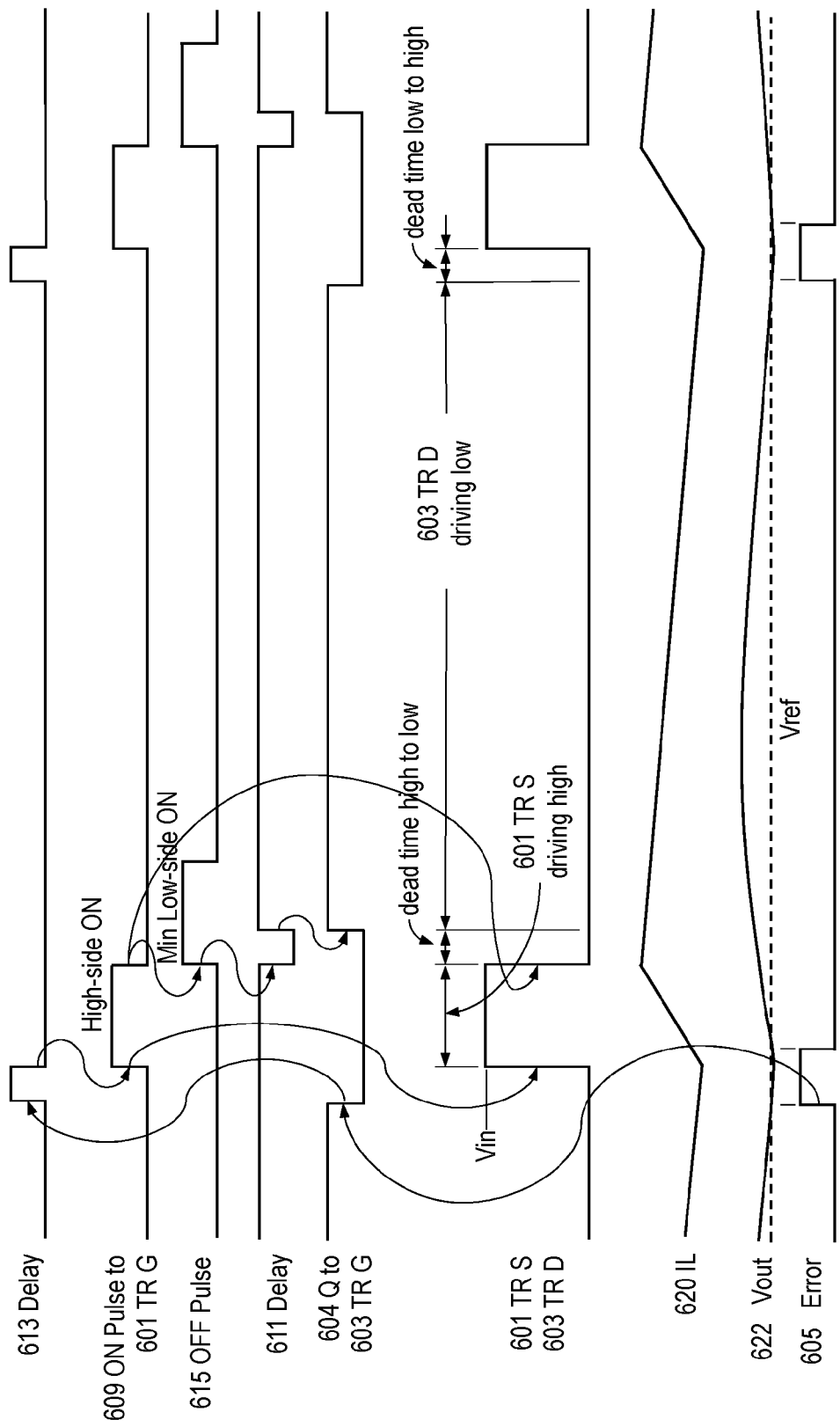
FIG. 6B is a signal diagram for the example hysteretic mode buck switching converter of FIG. 6A.

FIG. 6A illustrates a schematic diagram of an example hysteretic mode buck switching converter, according to one embodiment. The hysteretic mode buck switching converter shown in FIG. 6A may also be referred to as a bang-bang buck switching converter. FIG. 6B is a signal diagram for the example hysteretic mode buck switching converter of FIG. 6A. Although the present example shows an example of the analog and digital adaptive platform configured as a hysteretic mode buck switching converter, it is understood that the present adaptive platform can be configured as other devices including, but not limited to, a voltage mode buck switching converter, a current mode buck switching converter, a boost regulator, a buck-boost regulator, a low drop-out (LDO) regulator, a load switch, a mux, a battery charger, an external switching controller, a gate driver, and an integrator combining one or more thereof.

The programmable fabric can include a plurality of adaptive blocks, 601, 603, 605, 607, 609, 611, 613, and 615, each of which wrapped with respective digital wrappers 602, 604, 606, 608, 610, 612, 614, and 616. Among the adaptive blocks, the adaptive blocks 601 and 603 are high voltage power transistor blocks (herein also referred to as SIM blocks), the adaptive block 605 is a comparator block, the adaptive blocks 609, 611, 613, and 615 are timer blocks, and the adaptive block 607 is a voltage reference block.

Each of the high voltage power transistor blocks (e.g., the high voltage power transistor blocks 601 and 603) can be programmed for a specific target device/application and configured as, for example, but not limited to, a switcher, a linear operator, a current sense, and a protector. In the present example, the high voltage power transistor blocks 601 and 603 are programmed and configured as a switcher driving a high current output.

The comparator block 605 is configured to compare a voltage difference between an internal reference from the voltage reference block 607 and an external analog I/O signal $V_{feedback}$.

A timer block (e.g., the timer blocks 609, 611, 613, and 615) can be programmed to generate nanosecond, microsecond, and millisecond delays or pulses. The timer block can provide a precision dead-time control for improved efficiency. In the present example, the timer blocks 609 and 615 provide a constant-on-time pulse, and the timer blocks 611 and 613 are timers with a fixed delay specified by configuration.

A voltage reference block (e.g., the voltage reference block 607) can be used to provide a digitally-adjustable precision voltage reference. Voltage reference blocks can also provide protection for over current (OCP), over voltage (OVP), over temperature protection (OTP), under voltage-lockout (UVLO) references. In the present example, the voltage reference block 607 provides a fixed voltage reference specified at configuration, which provides the desired output voltage, $V_{ref}$.

The high voltage power transistor blocks 601 and 603 can drive the filter inductor 620 and the capacitor 621 in a synchronous mode as described in the signal diagram of FIG. 6B. The feedback voltage, $V_{feedback}$, from the filter output 622, $V_{out}$, is externally connected to the comparator block 605. The comparator block 605 compares the feedback voltage $V_{feedback}$ with a reference voltage, $V_{ref}$ to produce an error signal, Error=true if $V_{ref} \geq V_{feedback}$, or false if $V_{ref} < V_{feedback}$. The reference voltage, $V_{ref}$ is supplied from the voltage reference block 607 interconnected with the digital wrapper 608 and the digital wrapper 606 via the programmable fabric 650.

When the error signal 605 is true, the D-type flip-flop in the digital wrapper 604 is reset to turn off the high voltage power transistor block 603 and start the delay timer block 613. After this delay, the timer block 609 generates a constant-on-time pulse to turn on the high voltage power transistor block 601 through the connection made with digital wrapper 610 and digital wrapper 602 via the programmable fabric 650. The high voltage power transistor block 601 drives the inductor 620 to charge the output capacitor 621. When the pulse is completed, the falling edge of the pulse starts the minimum low-side ON pulse of the timer block 615 and sets the D-type flip-flop in the digital wrapper 604 after a fixed delay determined by the timer block 611 as shown in the signal diagram of FIG. 6B through the connection established with the digital wrapper 612 and the digital wrapper 604, and the connection established with the digital wrapper 610 and the digital wrapper 616 via the programmable fabric 650. The fixed delay is specified to ensure that the high-drive voltage power transistor block 601 is off, dead time, before the low-drive high voltage power transistor block 603 is turned on, preventing momentary shoot-through current as shown in the signal diagram of FIG. 6B. The D-type flip-flop in the digital wrapper 604 turns on the high voltage power transistor block 603 driving the inductor 620 to discharge the output capacitor 621.

The next cycle begins by first tuning off the low-side high voltage power transistor block 603 with a fixed delay reset pulse from the timer block 613 where the fixed delay is specified to ensure that the low-drive high voltage power transistor block 603 is off, dead time, before the high-drive voltage power transistor block 601 is turned on by the timer block 609, again, preventing momentary shoot-through current as shown in the signal diagram of FIG. 6B.

Figure 7A:
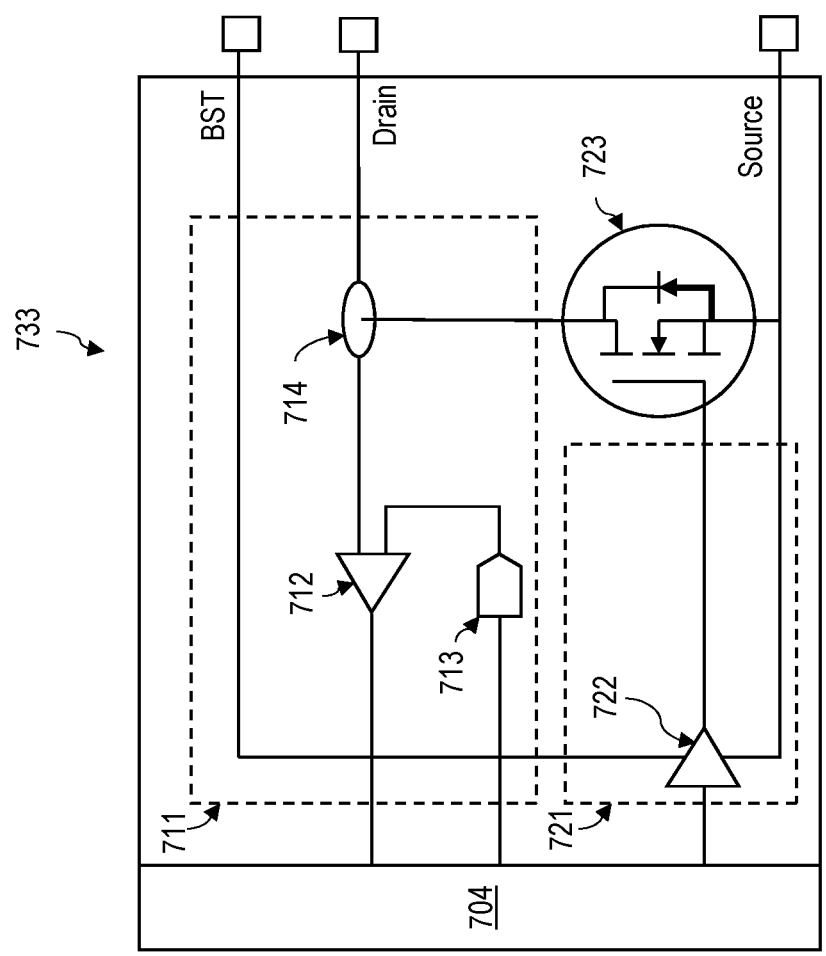
FIG. 7A is a schematic diagram of an example scalable integrated MOSFET (SIM) block, according to one embodiment.

FIG. 7A is a schematic diagram of an example scalable integrated MOSFET (SIM) block, according to one embodiment. Referring to FIG. 1, each of the high voltage power transistor blocks 103 of the PLD 100 may correspond to the SIM block 733. The SIM block 733 can be wrapped with a signal wrapper 704 that can be programmably configured correspondingly to a target device/application. Examples of the target device/application include, but are not limited to, a switcher, a linear operator, a current sense, and a protector.

According to one embodiment, characteristics of the SIM block 733 are programmably adjusted using the programmable fabric and the signal wrapper 704. The characteristics of the high voltage power transistor include one or more of an operational mode, a connectivity, a power consumption, a segmentation (a gain and a phase margin), an impedance, a current limit, a signal protection, and a reference voltage selection, which will be explained in further detail below.

The SIM block 733 includes a current sense comparator 711, a switch driver 721, and a high voltage power transistor 723. The gate of the high voltage power transistor 723 is connected to the gate driver 722 of the switch driver 721. The source and gate of the high voltage power transistor 723 can be connected to an external circuit component or an external device as shown in FIGS. 2 and 3. The drain of the high voltage power transistor 723 provides a current sense signal 714 to the current sense comparator 711.

According to one embodiment, the SIM block 733 can be configured to operate in a current mode using the current sense signal 714. The SIM block 733 can provide a digital slope compensation when operated in the current mode. For example, the SIM block 733 can run in a peak current mode, a current limit mode, and a current balancing mode and provide over-current protection and telemetry for a remote operation.

The current sense comparator 711 includes an analog comparator 712 and a digital-to-analog converter (DAC) 713. A digital input from the signal wrapper 704 may be fed to the DAC 713 to convert the digital input to an analog value, and the analog comparator 712 compares the analog value of the digital input with the current sense signal 714 to provide an output back to the signal wrapper 704 to indicate whether the current sense 714 is lower or higher than the digital input.

The switch driver 721 can be configured as a linear switch driver (e.g., analog switch driver) or a digital switch driver. The switch driver 721 is also referred to as a SIM switch or a SIM switcher in some embodiments. The current sense comparator 711 and the switch driver 721 of the SIM block 733 are connected to the signal wrapper 704 that is programmable to connect to digital wrappers of other adaptive blocks or I/O blocks of the PLD. The SIM block 733 also has an input voltage BST (boost) that can be used as an input to the gate driver 722 of the switch driver 721 to drive the high voltage power transistor 723.

The input voltage BST may be connected to an internal power supply with either a switch (active way) or a diode (passive way). For example, a cathode of the switch of the diode is connected to the BST and an anode of the switch of the diode is connected to the internal power supply. In addition, a capacitor may be connected between the BST and the source to maintain a voltage across the BST and the source. In the synchronous buck example shown in FIG. 3, when T1 is turned off and T2 is turned on, the source of T1 (e.g., 723 in FIG. 7A) is near ground. At this moment, the switch or the diode connecting internal power supply to the BST conducts current from the internal power supply to the capacitor (and the BST to the source) to recharge energy on the capacitor. When T2 is turned off and T1 is turned on, energy stored in the capacitor is used to provide voltage to drive high voltage power transistor 723.

According to one embodiment, the SIM block 733 can have multiple switching converter topologies and multi-phase topologies. The SIM block 733 can be configured for a singular or a paired operation in conjunction with one or more other SIM blocks or any other functional blocks that are integrated in the PLD. The single SIM configuration can achieve most flexibility while the paired SIM configuration can take advantage of the small footprint of the PLD.

Figure 7B:
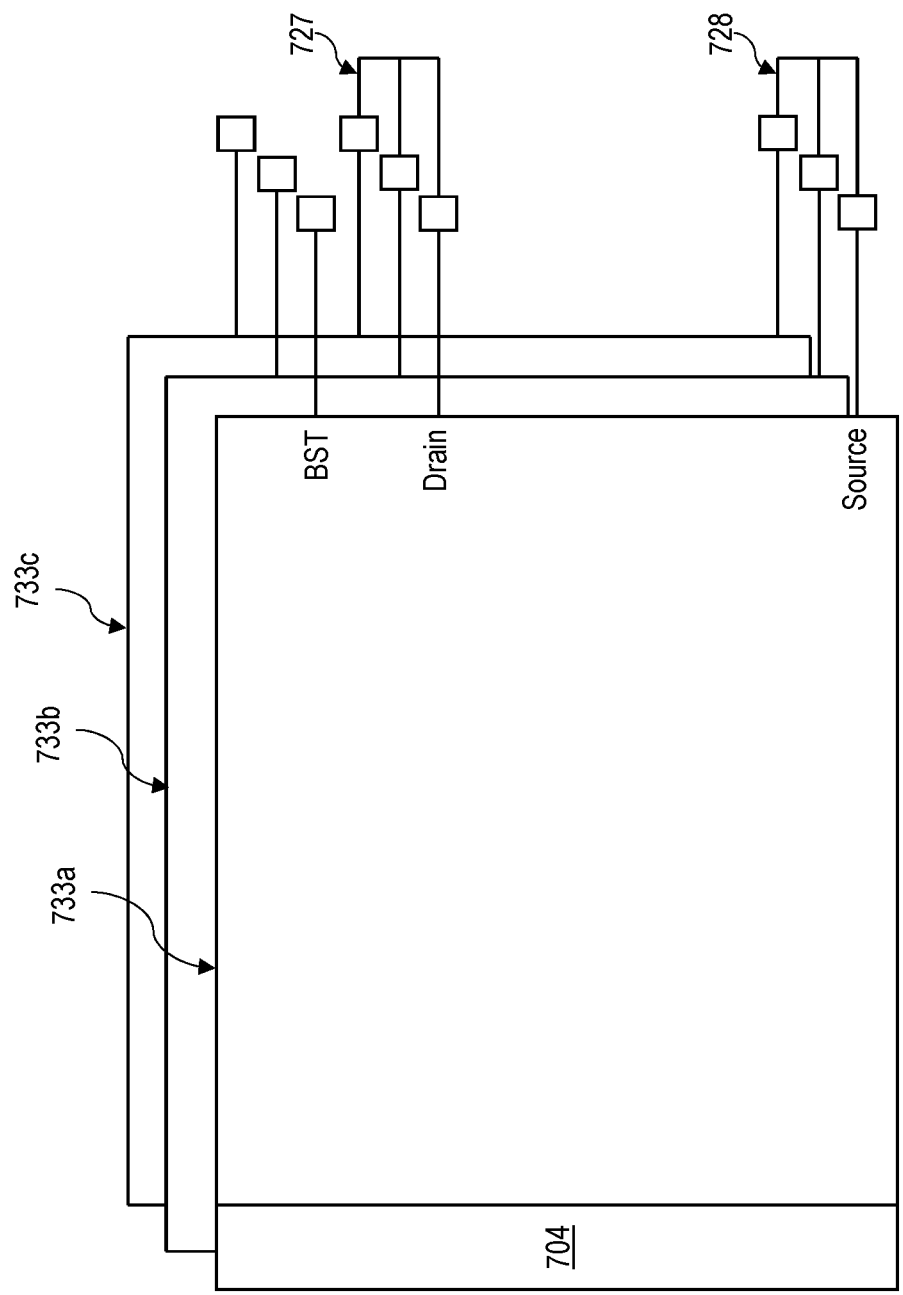
FIG. 7B is a schematic block diagram of multiple SIM blocks connected in parallel, according to one embodiment.

FIG. 7B shows a block diagram of multiple SIM blocks connected in parallel, according to one embodiment. In the present example, three SIM blocks 733a, 733b, and 733c are connected in parallel. However, it is noted that any number of SIM blocks 733 among those available in the PLD may be connected together to function as a specific device depending on a target device/application.

According to one embodiment, adjacent SIM blocks 733 can be combined together to provide a low on-resistance Rds(on) (e.g., 50 mΩ) when the programmed device is in saturation (on). No other extra circuit elements need be added or connected to the SIM blocks 733a, 733b, and 733c to achieve the low Rds(on). The connection and the control of the multiple SIM blocks 733a, 733b, and 733c can be done using one signal wrapper 704 or multiple signal wrappers 704s coupled to each of the SIM blocks 733a, 733b, and 733c. When making a parallel connection among the multiple SIM blocks 733a, 733b, and 733c, shorting wires 727 and 728 may be used to connect the drains and the sources. The shorting wires 727 and 728 may be externally provided or the drain and source pads of the SIM blocks 733a, 733b, and 733c may be programmably connected via the programmable fabric.

Referring to FIG. 7A, the SIM block 733 can have a high-current capacity to achieve more efficient operation with low power consumption. According to one embodiment, the high voltage power transistor 723 can be segmented into multiple segments (e.g., n segments) for optimizing a tradeoff between a gate capacitance gate charge (Qg) and a current capacity. For example, the high voltage power transistor 723 can include multiple transistors that are connected to one another, and each segment of the high voltage power transistor 723 may correspond to a respective transistor. In this case, the high voltage power transistor 723 shown in FIG. 7A represents multiple physically connected (and segmented) transistors. The segmentation of the high voltage power transistor 723 into multiple transistors can improve efficiency by lowering a switching loss that is mainly impacted by a switch resistance, and thus can lower the system's overall power consumption.

According to one embodiment, the number of segmented transistors and the characteristics of the high voltage power transistor 723 can be programmably controlled via the programmable fabric. When the required current of a target device is not high, less segments of the high voltage power transistor 723 may be used to effectively lower the gate charge (Qg) which in turn reduces a switching loss. By utilizing the current sense signal 714, the DAC 713, and the analog comparator 712, the SIM block 733 can regulate current flowing through the high voltage power transistor 723 to achieve a current mode control while achieving balanced current distribution.

According to the first embodiment, the SIM block 733 can be configured for a switch regulator. More specifically, the SIM block 733 can be configured as a high-side switch or a low-side switch of a buck regulator, a boost regulator, or a buck-boost regulator in either asynchronous or synchronous configuration. The high-side buck/boost can be supplemented with an external diode for asynchronous configuration. The SIM block 733 can be also configured as a push-pull gate driver of an external MOSFET.

Figure 7C:
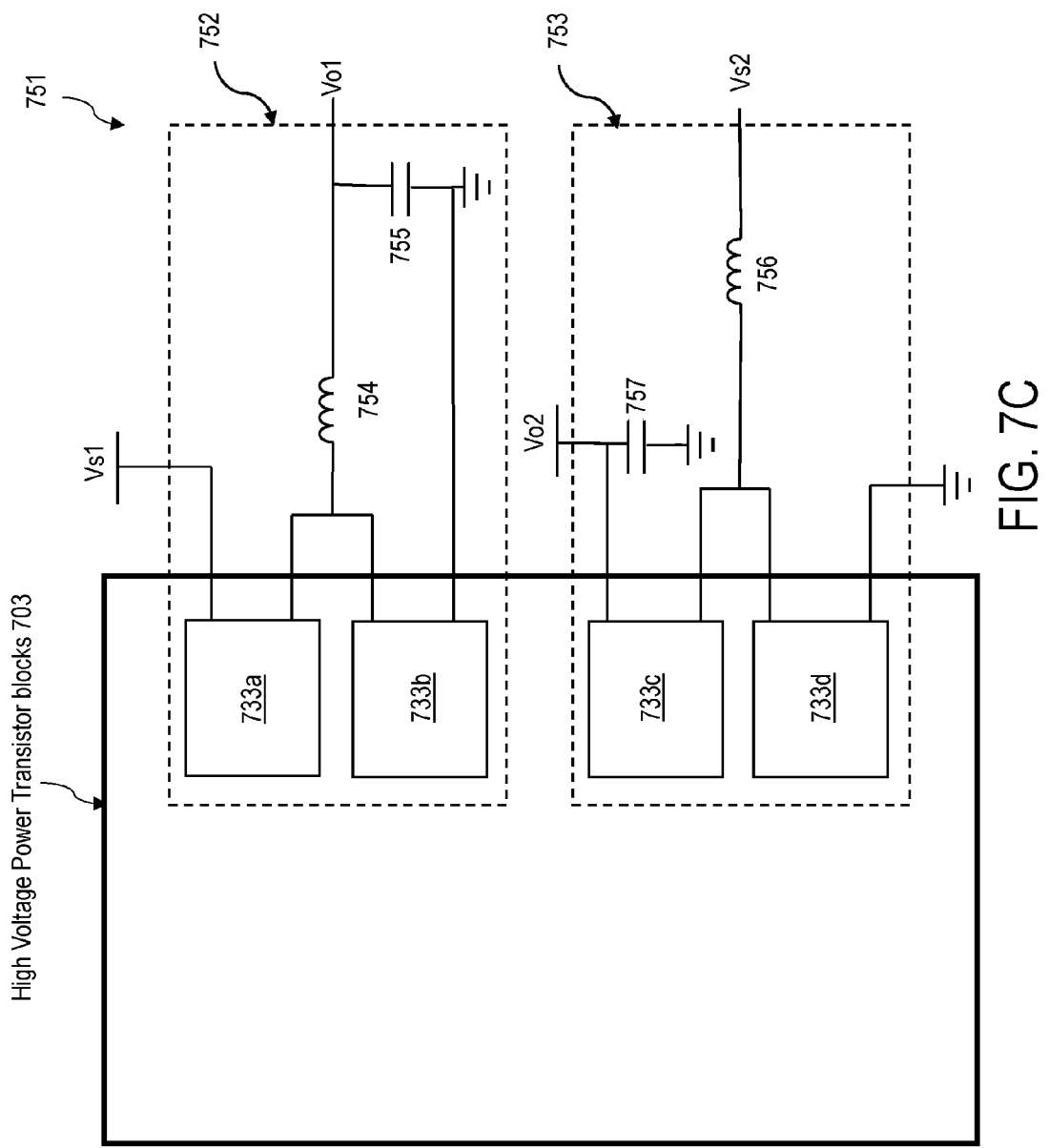
FIG. 7C shows example SIM blocks configured to include a buck regulator and a boost regulator, according to one embodiment.

FIG. 7C shows example SIM blocks configured to include a buck regulator and a boost regulator, according to one embodiment. The SIM blocks 751 include four SIM blocks 733a, 733b, 733c, and 733d. For example, the four SIM blocks 733a, 733b, 733c, and 733d are included in the high voltage power transistor blocks 703. The two top SIM blocks 733a and 733b are programmably connected and combined with an inductor 754 and a capacitor 755 to form a synchronous buck regulator 752, and the two bottom SIM blocks 733c and 733d are programmably connected and combined with an inductor 756 and a capacitor 757 to form a synchronous boost regulator 753. According to one embodiment, the SIM block 733b can be replaced with an external diode to form an asynchronous buck regulator in which a cathode of the diode is connected to a left side of the inductor 754 and an anode of the diode is connected to the ground. If the required current for a target device/application is higher than the current that the SIM block 733b can handle, the SIM block 733b may be used as a high-side switch for an external high voltage power transistor (e.g., the external high voltage power transistor 252 of FIG. 2) to provide a synchronous regulator. According to one embodiment, the SIM block 733c can be replaced with a diode to form an asynchronous boost regulator in which a cathode of the diode is connected to a top side of the capacitor 757 and an anode of the diode is connected to the left side of the inductor 756.

Figure 7D:
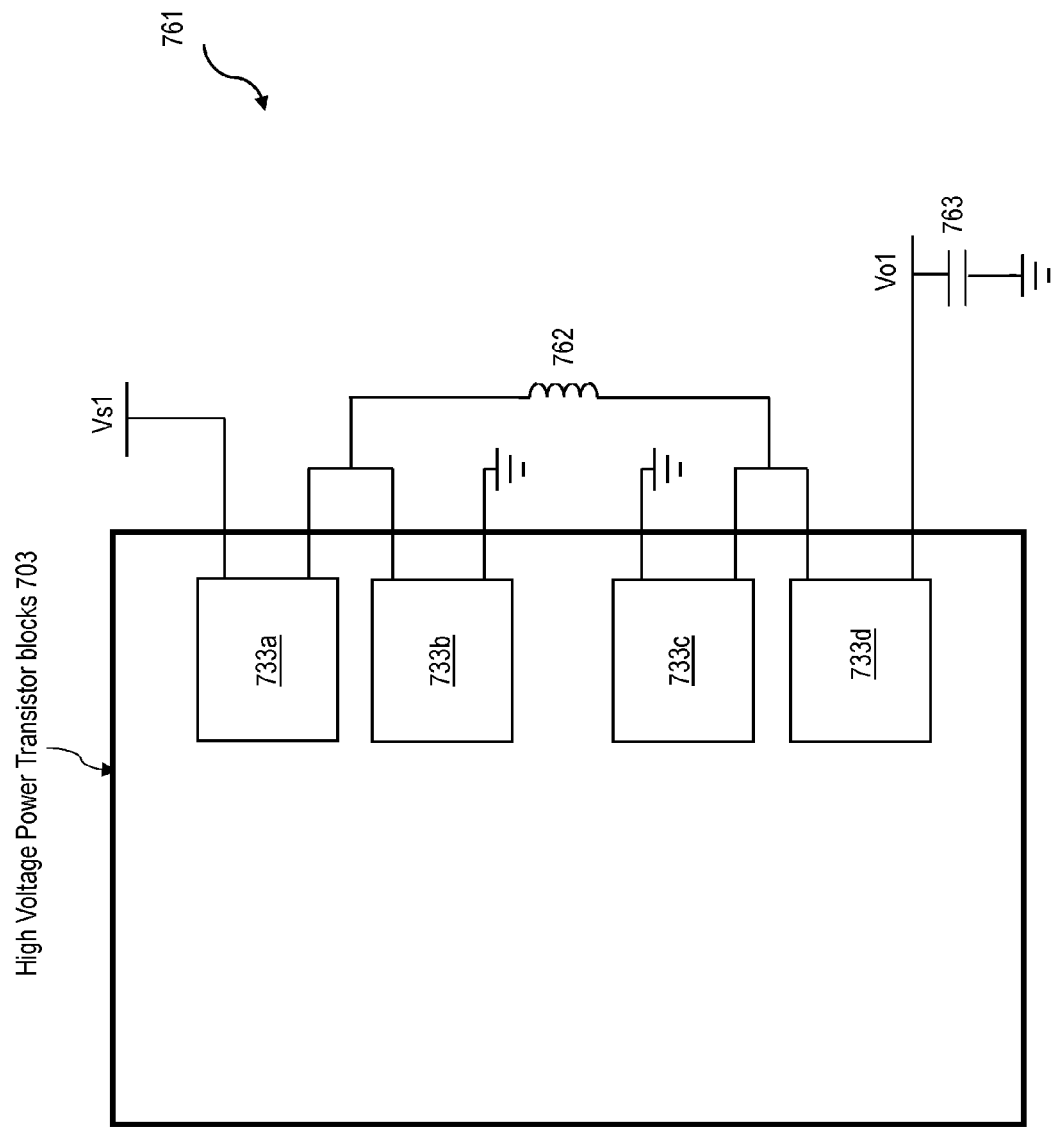
FIG. 7D shows an example synchronous buck-boost regulator, according to one embodiment.

FIG. 7D shows an example synchronous buck-boost regulator, according to one embodiment. The synchronous buck-boost regulator 761 includes four SIM blocks 733a, 733b, 733c, and 733d, an inductor 762, and a capacitor 763. According to one embodiment, the SIM block 733b can be replaced with a diode to form an asynchronous buck-boost regulator in which a cathode of the diode is connected to the inductor 762 and an anode of the diode is connected to the ground. Similarly, the SIM block 733d can be replaced with a diode to form an asynchronous buck-boost regulator in which a cathode of the diode is connected to the capacitor 763 and an anode of the diode is connected to the inductor 762.

Figure 7E:
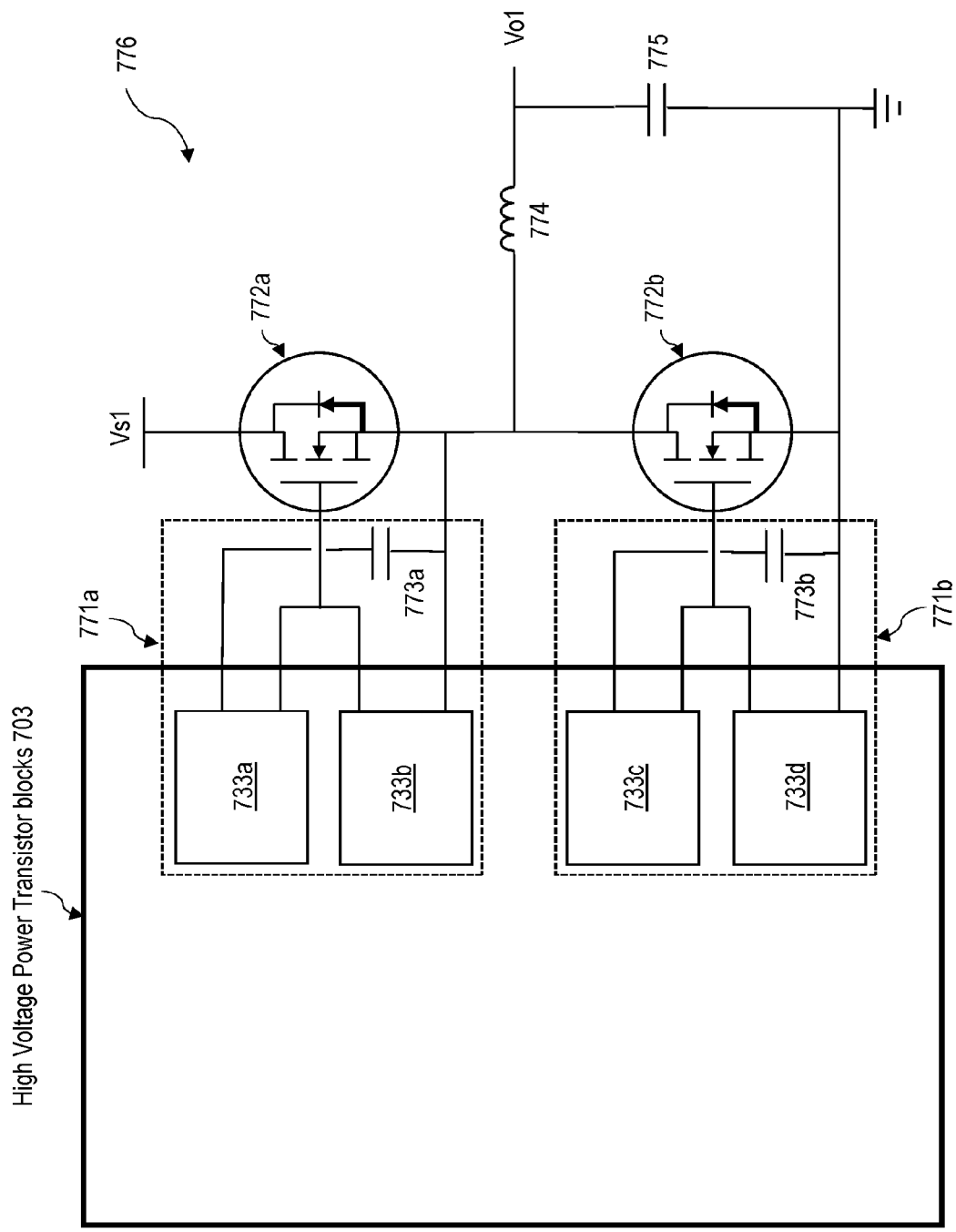
FIG. 7E shows an example of a synchronous buck regulator, according to one embodiment.

FIG. 7E shows an example of a synchronous buck regulator, according to one embodiment. The synchronous buck regulator 776 includes four SIM blocks 733a, 733b, 733c, and 733d, an inductor 774, and capacitors 773a, 773b, and 775, and a capacitor 775, and external transistors 772a and 772b. The two sets of push-pull gate drivers of the external transistors 772a and 772b can drive the synchronous buck regulator 776 with the inductor 774 and the capacitors 773a, 773b, and 775.

Figure 8A:
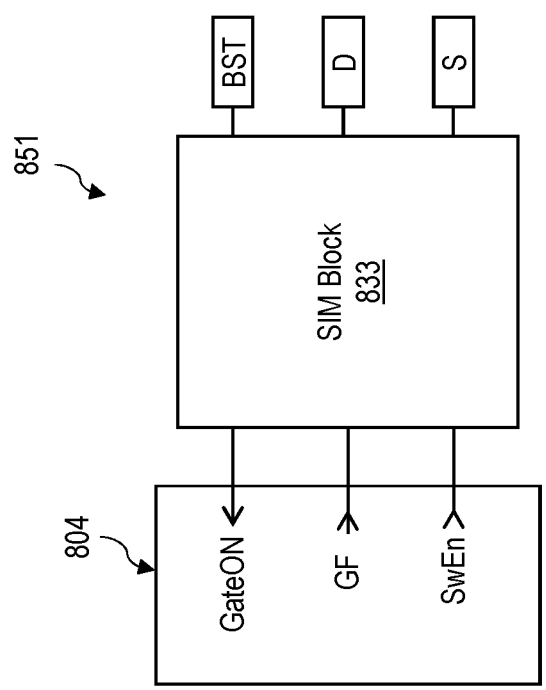
FIG. 8A shows a symbolic block diagram of an example SIM block configured as a switch regulator, according to one embodiment.
Figure 8B:
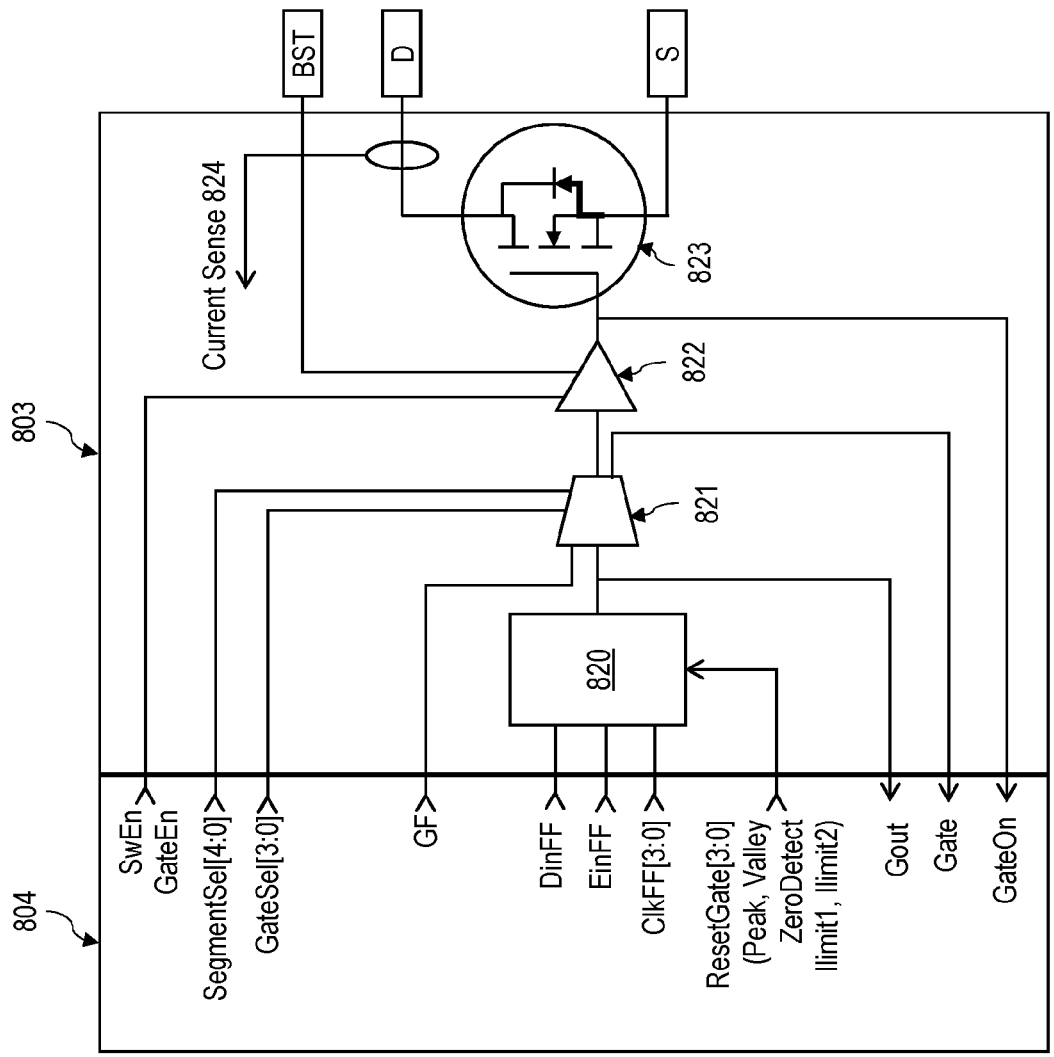
FIG. 8B shows a simplified circuit diagram of the SIM block shown in FIG. 8A.

FIG. 8A shows a symbolic block diagram of an example SIM block configured as a switch regulator, according to one embodiment. FIG. 8B shows a simplified circuit diagram of the SIM block shown in FIG. 8A. Referring to FIG. 8A, the SIM block 833 configured as the switch regulator 851 receives a digital input GF and a switch enable signal SwEn from a signal wrapper 804 and generates a gate on signal GateON (digital or analog) indicating the status of the switch regulator. The SIM block 833 provides external pins for connecting a voltage input BST, a drain (D), and a source (S) to external circuit components or external devices as shown in FIGS. 2 and 3.

The switch enable signal SwEn enables a switching mode operation of the switch SIM block 833. When the switch enable signal SwEn is low, a linear mode operation of the switch SIM block 833 is enabled. The GateEn signal ensures that the gate of the high voltage power transistor 823 is controlled by a PWM signal generated by a mux 821. The SegmentSel signal is used to choose the number of segments of the high voltage power transistor 823. In the present example, the SegmentSel signal is shown as a 5-bit signal, but it is understood that different number of bits may be used depending on the number of transistors included in the high voltage power transistor 823. The GateSel signal is used to choose a signal that generates the PWM signal to control the gate of the high voltage power transistor 823.

The GF signal is a PWM signal that is generated by the programmable fabric. The data input for flip-flop (DinFF), the enable input for flip-flop (EinFF), the clock input for flip-flop (ClkfFF), and ResetGate (enabling which reset signal directly resets a flip-flop 820 among the Peak/Valley, ZeroDetect, Ilimit1, Ilimit2) are controlling signals of the flip-flop 820 that generates the PWM signal. In particular, the Peak/Valley signal is a comparator output signal that is determined by the DAC/Current sensor 824. The ZeroDetect signal is a comparator output that is determined by a drain/source voltage of the high voltage power transistor 823. If the drain voltage is larger than the source voltage indicating that the current enters the drain and exits the source, the ZeroDetect signal is high. In contrast, if the source voltage is larger than the drain voltage indicating that the current enters the source and exits the drain, the ZeroDetect signal is low. The Ilimit1/Ilimit2 signals are comparator output signals that are determined by a predefined reference value and the current sense 824 indicating that the current flowing through the high voltage power transistor 823 exceeds the predefined value. The Gout signal is the output of the flip-flop 820. The Gate signal is the output of the mux 821. The gate on signal GateOn is a monitoring signal of the gate of the high voltage power transistor 823.

The SIM block 833 has a quick turn-on time, a low resistance compared to conventional analog ICs. The turn-on time of the high voltage power transistor 823 is adjustable by selecting different numbers of segments of the high voltage power transistor 823. For a quicker turn-on time, less segments of the high voltage power transistor 823 can be used. For a lower resistance, more segments of the high voltage power transistor 823 can be used. The gain and the phase margin of system can be adjusted by changing the numbers of segments. No segments can be selected for a shutdown mode. In one embodiment, the gate of the high voltage power transistor 823 is segmented into multiple individual gates (e.g., 15 gates). For example, two 6 Amp drivers can be coupled to function as a 12 Amp driver. The gate on signal GateOn can detect an actual on-status of the high voltage power transistor 823 to provide a precise timing control of high side and low side topologies. For further reduction of resistance, multiple high voltage power transistors can be parallelly connected as shown in FIG. 7B.

The signal wrapper 804 provides the interconnection between the SIM block 833 and a programmable fabric of the PLD that integrates the SIM block 833. After the signal wrapper 804 is properly programmed, the SIM block 833 is configured to function as the switching regulator 851. The gate of the high voltage power transistor 823 may be driven with the flip-flop 820 that is internal to the SIM block 833. In some embodiments, the gate of the high voltage power transistor 823 is driven directly from a signal (e.g., GF signal) on the programmable fabric or a flip-flop of an adjacent SIM block. The flip-flop 820 can be set and reset by an internal logic using signals available in the programmable fabric or any other internal or external signals such as the Peak/Valley, Ilimit1, Ilimit2, ZeroDetect, etc.

Figure 9A:
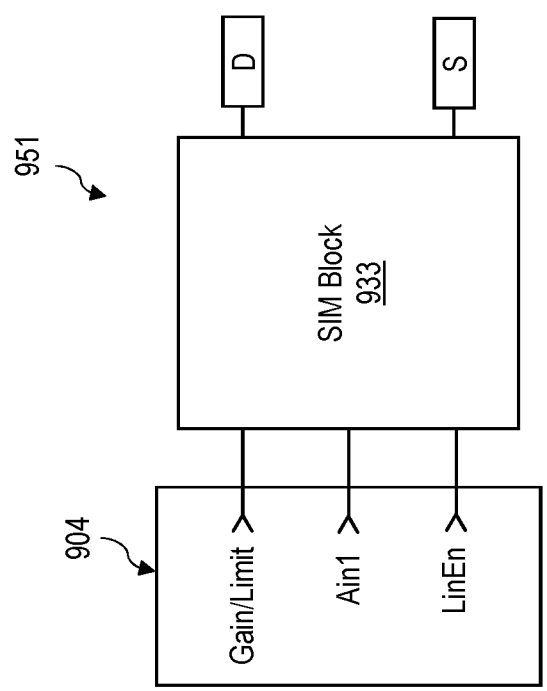
FIG. 9A shows a symbolic block diagram of an example SIM block configured as a linear regulator, according to one embodiment.
Figure 9B:
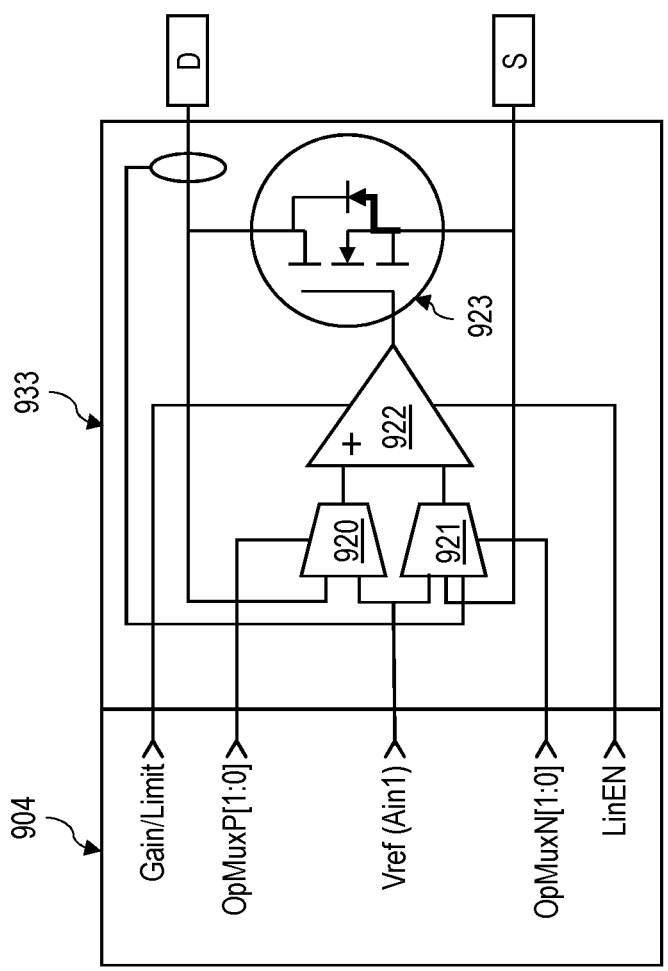
FIG. 9B shows a simplified circuit diagram of the linear regulator shown in FIG. 9A.

FIG. 9A shows a symbolic block diagram of an example SIM block configured as a linear regulator, according to one embodiment. FIG. 9B shows a simplified circuit diagram of the linear regulator shown in FIG. 9A. For example, the linear regulator 951 is a low drop out (LDO) linear regulator. The source side LDO operation can be either a constant voltage LDO operation or a constant current LDO operation. The drain side LDO can be used for a power path (e.g., a battery).

The linear regulator 951 includes to muxes 920 and 921 that are used to select a signal provided to the linear operational amplifier (Op Amp) 922. The gate of the high voltage power transistor 923 is driven by the Op Amp 922. The inputs to the Op Amp 922 include the source and the drain of the high voltage power transistor 923 and one or more signals received from the programmable fabric via the signal wrapper 904 including a programmable reference Vref. The gain of the Op Amp 922 is selectable from a plurality of preset values available from the programmable fabric. For example, if a source side LDO is to be used, the mux 920 selects the reference voltage signal Vref, and the mux 921 uses the source as a feedback signal to regulate the source voltage to the voltage of the reference voltage signal Vref. If a drain side LDO is to be used, the mux 920 select a drain as a feedback signal, and the mux 921 selects the reference voltage signal Vref to regulate the drain voltage to the voltage of the reference voltage signal Vref.

Figure 9C:
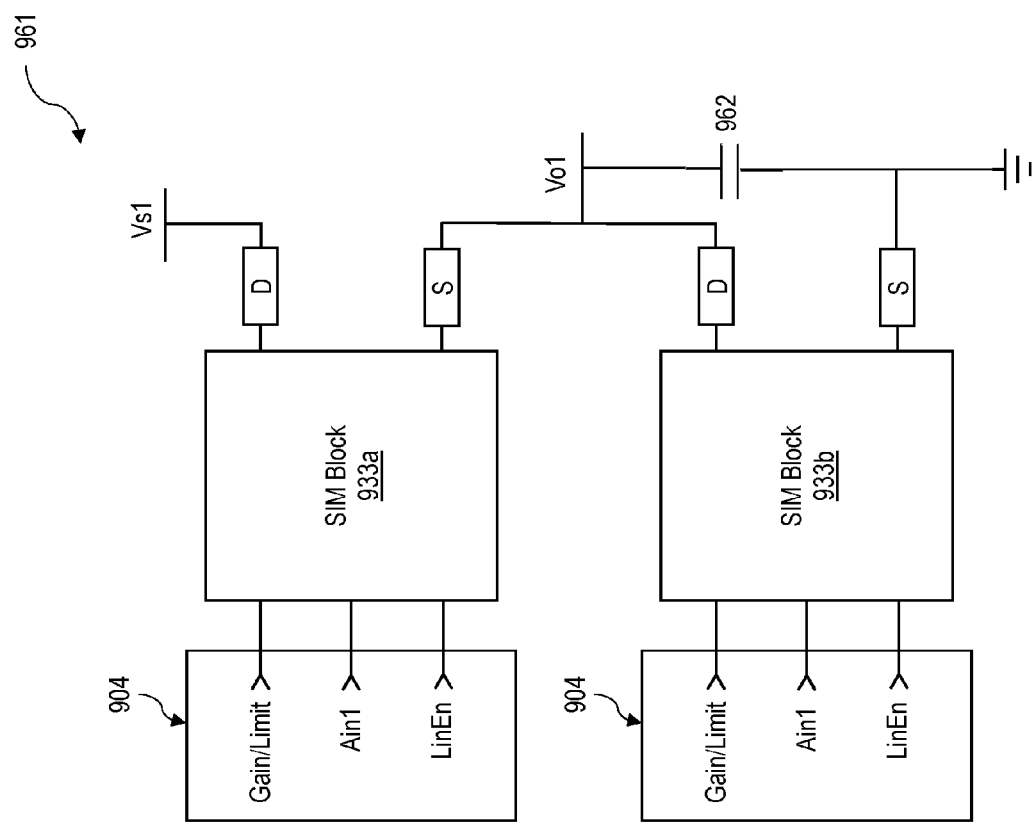
FIG. 9C shows a symbolic block diagram of example SIM blocks configured as a push-pull driver, according to one embodiment.

According to one embodiment, the SIM block 933 can be also configured as a push-pull driver. FIG. 9C shows a symbolic block diagram of example SIM blocks configured as a push-pull driver, according to one embodiment. The top SIM block 933a is configured to be a source side LDO, and the bottom SIM block 933b is configured as a drain side LDO. The push-pull driver 961 can regulate the output voltage Vo1 using the source side LDO and the drain side LDO. The SIM block can also be configured as a slew rate controller for controlling inrush current protection and a programmable ramp rate for soft start/stop.

Figure 10A:
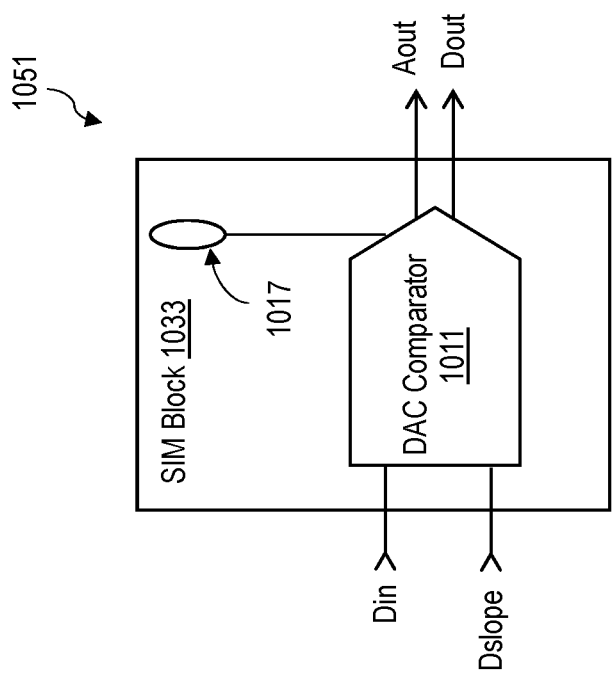
FIG. 10A shows a symbolic block diagram of an example SIM block configured as a current sensor, according to one embodiment.
Figure 10B:
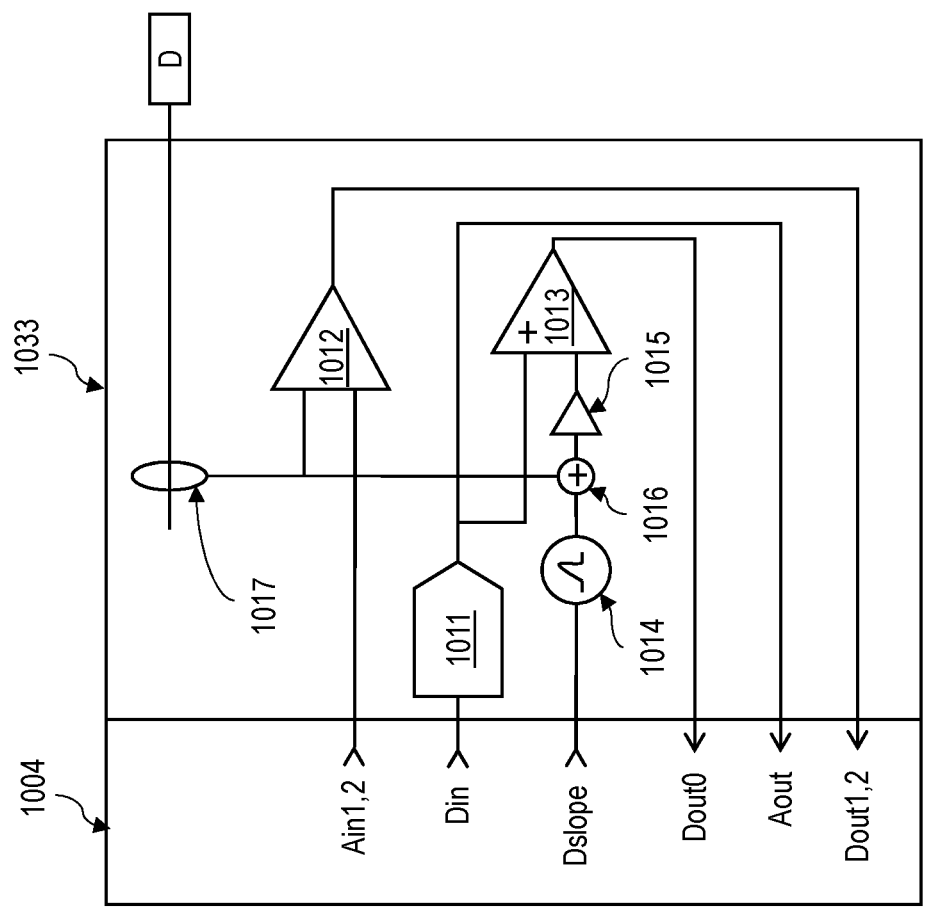
FIG. 10B shows a simplified circuit diagram of the current sensor shown in FIG. 10A.

FIG. 10A shows a symbolic block diagram of an example SIM block configured as a current sensor, according to one embodiment. FIG. 10B shows a simplified circuit diagram of the current sensor shown in FIG. 10A. The current sensor 1051 includes a DAC comparator 1011 for providing current regulation and current protection.

The current sensor 1051 uses a current monitor 1017 to sense the current flowing through a high voltage power transistor (not shown). The current sensed by the current monitor 1017 is sent to two comparators 1012 and 1013. The output of the comparator 1012 can be used to provide current protection (herein also referred to as over-current protection) to turn off the high voltage power transistor by terminating a duty cycle. The comparator 1013 can regulate the current flowing through the high voltage power transistor delivered to the output. In addition, the comparator 1013 estimates the delivered current through the high voltage power transistor using the operation of successive approximation starting from the digital input signal Din0 and the digital slope Dslope to the digital output signal Dout0.

In one embodiment, the current of the drain of the high voltage power transistor (not shown) is sensed and compared with the DAC comparator 1011 (e.g., 10-bit DAC) to detect a peak or valley threshold crossover for functions required by another device configured within the same PLD or another PLD, for example, a current-mode buck regulator. The DAC reference may be modulated by a current slope compensation ramp 1014. The digital slope Dslope is programmably generated via the signal wrapper 1004 associated with the SIM block 1033. For example, the current slope ramp 1014 is selectable from one or more predetermined values (e.g., 16 values). The current slope compensation ramp 1014 receives the digital slope Dslope as an input and generates an analog output signal that is slope-compensated by the value of the digital slope Dslope. The analog output of the current slope compensation ramp 1014 and the current measured from the current monitor 1017 are added at an adder 1016. The output of the adder 1016 is multiplied with the current sense gain using a current gain amplifier 1015. For example, the current sense gain is selectable from one or more predetermined values (e.g., 4 values). The DAC comparator 1011 may be used independently from the SIM block 1033 by outputting its analog voltages to the programmable fabric of the PLD that integrates the SIM block 1033. Similarly, the source, the drain, and the current sense values may be output to the analog fabric of the PLD.

Figure 11A:
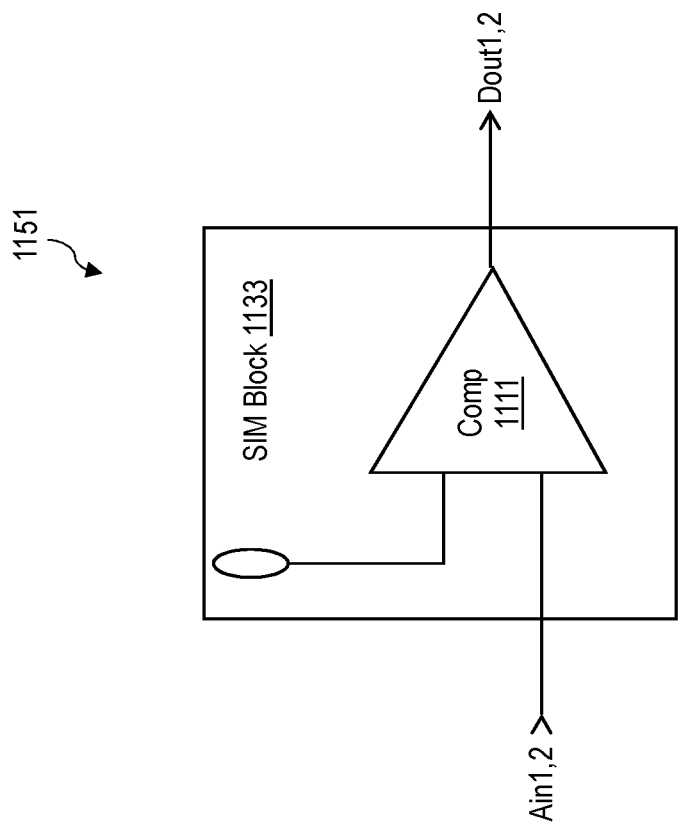
FIG. 11A shows a symbolic block diagram of an example SIM block configured as a current protection block, according to one embodiment.
Figure 11B:
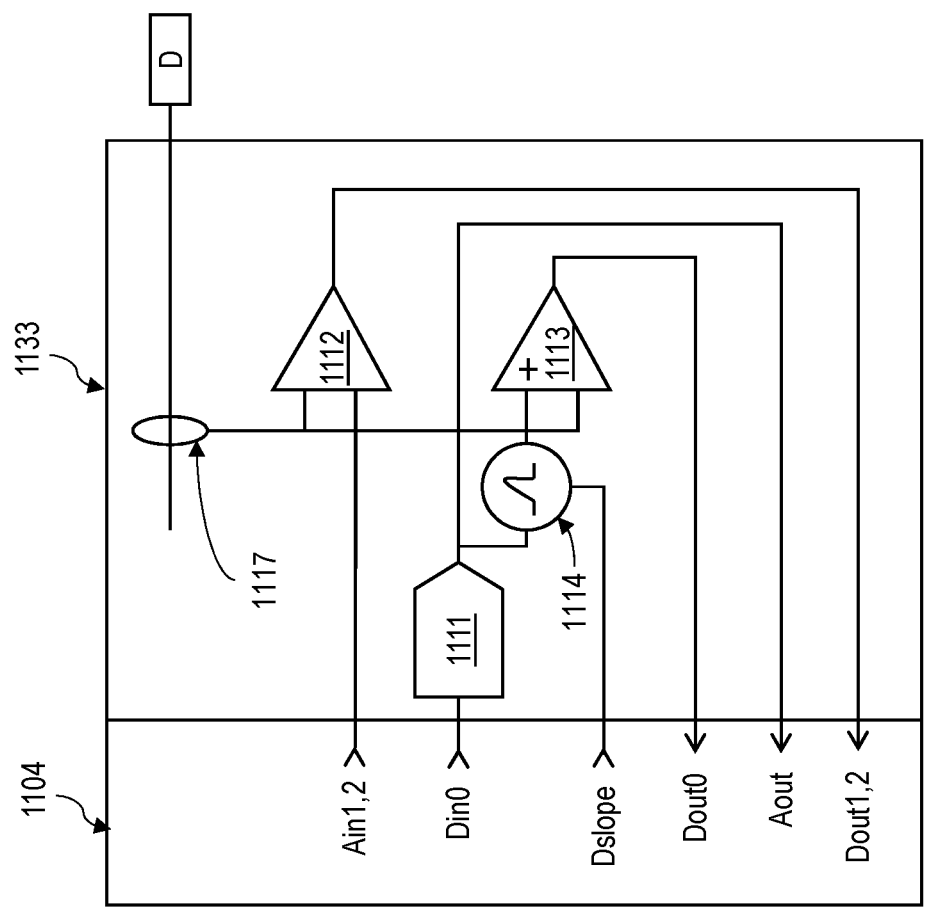
FIG. 11B shows a simplified circuit diagram of the current protection block shown in FIG. 11A.

FIG. 11A shows a symbolic block diagram of an example SIM block configured as a current protection block, according to one embodiment. FIG. 11B shows a simplified circuit diagram of the current protection block shown in FIG. 11A. The current protection block 1151 provides interconnection between the digital fabric and the analog fabric of the programmable fabric and detects a current threshold crossover for over current protection (OCP). In addition, current protection block 1151 can provide a zero crossing detect by comparing the source with drain voltages.

Similar to the current sensor shown in FIGS. 10A and 10B, the current protection block 1151 provides current sensing. The current protection block 1151 can monitor the output of the DAC comparator 1111 while changing the input Din0. This approach is similar to the operation of a successive approximation ADC, where different input Din0 is provided to approximate the current value by monitoring the output of comparator 1113.

In the present example, current protection is achieved by comparing a predefined analog levels Ain1,2 with the sensed current using the comparator 1112. When the comparator 1112 changes its output, the current protection block 1151 terminates a duty cycle of the high voltage MOSFET. For example, 0.5V is input as an analog level corresponding to 5 A. The comparator 1112 changes its output when the sensed current reaches 5 A and sends a signal to stop the high voltage transistor from conducting the current.

According to one embodiment, a high voltage power block includes: a high voltage power transistor; and a switch driver configured to drive a gate of the high voltage power transistor. The high voltage power block is integrated in a programmable logic device (PLD) including a programmable fabric, a signal wrapper configured to provide signals between the high voltage power block and the programmable fabric, and a plurality of internal components. The plurality of internal components integrated in the PLD are programmably connected and characteristics of the high voltage power transistor are programmably adjusted using the programmable fabric and the signal wrapper.

A source and a drain of the high voltage power transistor may be provided on a source pad and a drain pad to connect to external signals and components.

The PLD may be configured as one of a buck regulator, a boost regulator, a multiphase buck regulator, a buck-boost regulator, a source side regulator, a drain-side regulator, a push-pull DDR regulator, a load switch, and a battery charger by programming the programmable fabric and configuring the characteristics of the high voltage power transistor.

The high voltage power block may further include a current sense comparator configured to compare sensed current flowing through the high voltage power transistor and an analog reference signal, and the current sense comparator may further include a digital-to-analog converter (DAC) and an analog comparator.

A digital input signal received from the signal wrapper may be provided to the DAC to convert the digital input signal to the analog reference signal. The comparator may compare the analog reference signal with the sensed current to provide an output signal to the signal wrapper indicating whether the sensed current flowing through the high voltage power transistor is lower or higher than the digital input signal.

The high voltage power transistor may be segmented into a plurality of transistors.

A number of the plurality of transistors to use to form the high voltage power transistor and characteristics of the high voltage power are programmable via the programmable fabric.

A subset of transistors among the plurality of transistors may be programmed to change the characteristics of the high voltage power transistor via the programmable fabric.

The PLD may include a plurality of high voltage power blocks including the high voltage power block.

The plurality of high voltage power blocks may be programmably connected in parallel via the programmably fabric and respective signal wrappers corresponding to the plurality of high voltage power blocks.

Shorting wires may connect drain pads of the plurality of high voltage power blocks and source pads of the plurality of high voltage power blocks, respectively.

The programmable fabric may be programmed to program a turn-on sequence, a turn-off sequence, and a switching frequency of high voltage power transistors of the plurality of high voltage power blocks.

One or more of the plurality of high voltage power blocks may be programmably configured as one of a buck regulator, a boost regulator, a buck-boost regulator, a switch regulator, a linear regulator, a push-pull driver, a current sensor, and a current protection block.

The high voltage power block may further include a flip-flop and a mux.

A gate of the high voltage power transistor may be driven from an internal PWM signal on the programmable fabric or from a flip-flop of an adjacent high voltage power block integrated in the PLD.

According to another embodiment, a programmable logic device (PLD) includes: a plurality of high voltage power blocks; a programmable fabric; a plurality of signal wrappers, each of the plurality of signal wrappers being configured to provide signals between the corresponding high voltage power block and the programmable fabric; and a plurality of internal components. Each of the plurality of high voltage power blocks includes: a high voltage power transistor; and a switch driver configured to drive a gate of the high voltage power transistor. The plurality of internal components integrated in the PLD are programmably connected and characteristics of the high voltage power transistor are programmably adjusted using the programmable fabric and the signal wrapper.

The PLD may be configured as one of a buck regulator, a boost regulator, a multiphase buck regulator, a buck-boost regulator, a source side regulator, a drain-side regulator, a push-pull DDR regulator, a load switch, and a battery charger by programming the programmable fabric and configuring the characteristics of the high voltage power transistor.

The plurality of high voltage power blocks may be programmably connected in parallel via the programmable fabric and respective signal wrappers corresponding to the plurality of high voltage power blocks.

The programmable fabric may be programmed to program a turn-on sequence, a turn-off sequence, and a switching frequency of high voltage power transistors of the plurality of high voltage power blocks.

One or more of the plurality of high voltage power blocks may be programmably configured as one of a buck regulator, a boost regulator, a buck-boost regulator, a switch regulator, a linear regulator, a push-pull driver, a current sensor, and a current protection block.

The above example embodiments have been described hereinabove to illustrate various embodiments of implementing a system and method for providing a scalable metal-oxide-semiconductor field-effect transistor (MOSFET) block integrated in a PLD. Various modifications and departures from the disclosed example embodiments will occur to those having ordinary skill in the art. The subject matter that is intended to be within the scope of the invention is set forth in the following claims.

What is claimed is:

1. A high voltage power block comprising:
   a high voltage power transistor; and
   a switch driver configured to drive a gate of the high voltage power transistor;
   wherein the high voltage power block is integrated in a programmable logic device (PLD) including a programmable fabric, a signal wrapper configured to provide signals between the high voltage power block and the programmable fabric, and a plurality of internal components, and
   wherein the plurality of internal components integrated in the PLD are programmably connected and characteristics of the high voltage power transistor are programmably adjusted using the programmable fabric and the signal wrapper, and
   wherein the high voltage power block further comprises a current sense comparator configured to compare sensed current flowing through the high voltage power transistor and an analog reference signal, wherein the current sense comparator comprises a digital-to-analog converter (DAC) and an analog comparator.

2. The high voltage power block of claim 1, wherein a source and a drain of the high voltage power transistor are provided on a source pad and a drain pad to connect to external signals and components.

3. The high voltage power block of claim 1, wherein the PLD is configured as one of a buck regulator, a boost regulator, a multiphase buck regulator, a buck-boost regulator, a source side regulator, a drain-side regulator, a push-pull DDR regulator, a load switch, and a battery charger by programming the programmable fabric and configuring the characteristics of the high voltage power transistor.

4. The high voltage power block of claim 1, wherein the characteristics of the high voltage power transistor include one or more of an operational mode, a connectivity, a power consumption, a segmentation, an impedance, a current limit, a signal protection, and a reference voltage selection.

5. The high voltage power block of claim 1, wherein a digital input signal received from the signal wrapper is provided to the DAC to convert the digital input signal to the analog reference signal, and wherein the comparator compares the analog reference signal with the sensed current to provide an output signal to the signal wrapper indicating whether the sensed current flowing through the high voltage power transistor is lower or higher than the digital input signal.

6. The high voltage power block of claim 1, wherein the high voltage power transistor is segmented into a plurality of transistors.

7. The high voltage power block of claim 6, wherein a number of the plurality of transistors to use to form the high voltage power transistor and characteristics of the high voltage power are programmable via the programmable fabric.

8. The high voltage power block of claim 6, wherein a subset of transistors among the plurality of transistors is programmed to change the characteristics of the high voltage power transistor via the programmable fabric.

9. The high voltage power block of claim 1, wherein the high voltage power block further comprises a flip-flop and a mux.

10. The high voltage power block of claim 9, wherein a gate of the high voltage power transistor is driven from an internal PWM signal on the programmable fabric or from a flip-flop of an adjacent high voltage power block integrated in the PLD.

11. A high voltage power block comprising:
a high voltage power transistor; and
a switch driver configured to drive a gate of the high voltage power transistor;
wherein the high voltage power block is integrated in a programmable logic device (PLD) including a programmable fabric, a signal wrapper configured to provide signals between the high voltage power block and the programmable fabric, and a plurality of internal components, and
wherein the plurality of internal components integrated in the PLD are programmably connected and characteristics of the high voltage power transistor are programmably adjusted using the programmable fabric and the signal wrapper,
wherein the PLD includes a plurality of high voltage power blocks including the high voltage power block, and
wherein shorting wires connect drain pads of the plurality of high voltage power blocks and source pads of the plurality of high voltage power blocks, respectively.

12. The high voltage power block of claim 11, and the plurality of high voltage power blocks is programmably connected in parallel via the programmably fabric and respective signal wrappers corresponding to the plurality of high voltage power blocks.

13. The high voltage power block of claim 11, wherein the programmable fabric is programmed to program a turn-on sequence, a turn-off sequence, and a switching frequency of high voltage power transistors of the plurality of high voltage power blocks.

14. The high voltage power block of claim 11, wherein one or more of the plurality of high voltage power blocks are programmably configured as one of a buck regulator, a boost regulator, a buck-boost regulator, a switch regulator, a linear regulator, a push-pull driver, a current sensor, and a current protection block.

15. A programmable logic device (PLD) comprising:
a plurality of high voltage power blocks;
a programmable fabric;
a plurality of signal wrappers, each of the plurality of signal wrappers being configured to provide signals between the corresponding high voltage power block and the programmable fabric; and
a plurality of internal components,
wherein each of the plurality of high voltage power blocks comprises:
a high voltage power transistor; and
a switch driver configured to drive a gate of the high voltage power transistor,
wherein the plurality of internal components integrated in the PLD are programmably connected and characteristics of the high voltage power transistor are programmably adjusted using the programmable fabric and the signal wrapper, and
wherein the gate of the high voltage power transistor is driven from the switch driver using an internal PWM signal on the programmable fabric or from a flip-flop of an adjacent high voltage power block integrated in the PLD.

16. The PLD of claim 15, wherein the PLD is configured as one of a buck regulator, a boost regulator, a multiphase buck regulator, a buck-boost regulator, a source side regulator, a drain-side regulator, a push-pull DDR regulator, a load switch, and a battery charger by programming the programmable fabric and configuring the characteristics of the high voltage power transistor.

17. The PLD of claim 15, wherein the characteristics of the high voltage power transistor include one or more of an operational mode, a connectivity, a power consumption, a segmentation, an impedance, a current limit, a signal protection, and a reference voltage selection.

18. The PLD of claim 15, wherein the plurality of high voltage power blocks is programmably connected in parallel via the programmable fabric and respective signal wrappers corresponding to the plurality of high voltage power blocks.

19. The PLD of claim 15, wherein the programmable fabric is programmed to program a turn-on sequence, a turn-off sequence, and a switching frequency of high voltage power transistors of the plurality of high voltage power blocks.

20. The PLD of claim 15, wherein one or more of the plurality of high voltage power blocks are programmably configured as one of a buck regulator, a boost regulator, a buck-boost regulator, a switch regulator, a linear regulator, a push-pull driver, a current sensor, and a current protection block.

* * * * *